(12) United States Patent
Kim et al.

(10) Patent No.: US 8,043,923 B2
(45) Date of Patent: Oct. 25, 2011

(54) METHOD OF MANUFACTURING SEMICONDUCTOR DEVICE

(75) Inventors: Sung-Hwan Kim, Suwon-si (KR); Yamada Satoru, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/944,896

(22) Filed: Nov. 12, 2010

(65) Prior Publication Data
US 2011/0124173 A1    May 26, 2011

(30) Foreign Application Priority Data
Nov. 25, 2009    (KR) .................... 10-2009-0114439

(51) Int. Cl.
*H01L 21/336* (2006.01)
(52) U.S. Cl. ........ 438/305; 438/299; 438/303; 438/306; 257/344; 257/408
(58) Field of Classification Search .............. 257/344, 257/408; 438/299, 303, 305, 306
See application file for complete search history.

(56) References Cited

U.S. PATENT DOCUMENTS

| | | | | |
|---|---|---|---|---|
| 4,753,898 A * | 6/1988 | Parrillo et al. | ............... | 438/231 |
| 5,591,659 A * | 1/1997 | Ema et al. | ............... | 438/241 |
| 5,937,315 A * | 8/1999 | Xiang et al. | ............... | 438/486 |
| 6,323,077 B1 * | 11/2001 | Guo | ............... | 438/231 |
| 6,329,232 B1 * | 12/2001 | Yang et al. | ............... | 438/197 |
| 6,472,283 B1 * | 10/2002 | Ishida et al. | ............... | 438/305 |
| 7,265,051 B2 * | 9/2007 | Kim et al. | ............... | 438/672 |
| 7,413,961 B2 | 8/2008 | Chong et al. | | |

FOREIGN PATENT DOCUMENTS

| | | |
|---|---|---|
| JP | 2001-094100 | 4/2001 |
| KR | 1020040087500 | 10/2004 |

* cited by examiner

*Primary Examiner* — Jarrett Stark
*Assistant Examiner* — Nicholas Tobergte
(74) *Attorney, Agent, or Firm* — Myers Bigel Sibley & Sajovec

(57) ABSTRACT

Methods of manufacturing a semiconductor device include forming a gate electrode on a semiconductor substrate, forming spacers on side walls of the gate electrode, and doping impurities into the semiconductor substrate on both sides of the spacers to form highly doped impurity regions. The spacers are selectively etched to expose portions of the semiconductor substrate, and more lightly doped impurity regions are formed in the semiconductor substrate between the highly doped impurity regions and the gate electrode.

21 Claims, 25 Drawing Sheets

METHOD OF MANUFACTURING SEMICONDUCTOR DEVICE

CLAIM OF PRIORITY

This application claims priority under 35 USC §119 to Korean Patent Application No. 10-2009-0114439, filed on Nov. 25, 2009 in the Korean Intellectual Property Office (KIPO), the disclosure of which is herein incorporated by reference in its entirety.

BACKGROUND

Some embodiments relate to methods of manufacturing a semiconductor device. More particularly, some embodiments relate to methods of manufacturing a semiconductor device including a metal oxide semiconductor (MOS) transistor having a reduced overlapping capacitance.

Generally, as semiconductor devices become more highly integrated, short channel effects in MOS transistors have become more problematic. In order to reduce the prevalence of short channel effects, source/drain regions of MOS transistors have been formed to have a lightly doped drain (LDD) structure.

FIG. 1 illustrates an LDD structure formed by using an offset dual spacer (ODS).

The LDD structure illustrated in FIG. 1 may include two offset spacers 25 and 40 formed on side walls of a gate electrode 15 formed on a substrate 10. At the bottom portion of the gate electrode 15, a gate oxide layer 12 may be formed, and at a side wall of the gate electrode 15, a side wall oxide spacer 20 may be formed. By using the two offset spacers 25 and 40, a lightly doped impurity region 30 and a highly doped impurity region 45 may be formed.

FIG. 2 illustrates an LDD structure formed by using an offset single spacer (OSS).

The LDD structure illustrated in FIG. 2 may include one offset spacer 25 formed on a side wall of a gate electrode 15.

Referring to FIGS. 1 and 2, the ODS and OSS LDD structures may have little difference in terms of a shape of the spacers and a shape of impurity regions. However, the LDD structures show a very large difference in electric characteristics. The differences in the electric characteristics of MOS devices including ODS and OSS LDD structures are shown in FIGS. 3 to 8.

FIGS. 3 to 5 illustrate graphs for comparing a current, a driving voltage and a gate overlapping capacitance value of each NMOS transistor having an LDD structure formed by using an ODS or an OSS.

Referring to FIG. 3, the NMOS transistor formed by using the OSS shows a slight decrease but no improvement of a driving current when compared to the NMOS transistor formed by using the ODS.

Referring to FIG. 4, the NMOS transistor formed by using the OSS shows an improvement in an average driving voltage by about 5 mV when compared to the NMOS transistor formed by using the ODS.

Referring to FIG. 5, the NMOS transistor formed by using the OSS shows a decrease of a gate overlapping capacitance value by about 3.0% when compared to the NMOS transistor formed by using the ODS.

FIGS. 6 to 8 illustrate graphs for comparing a current, a driving voltage and a gate overlapping capacitance value of each PMOS transistor having an LDD structure formed by using an ODS or an OSS.

Referring to FIG. 6, the PMOS transistor formed by using the OSS shows an improvement in a driving current by about 7.44% when compared to the PMOS transistor formed by using the ODS.

Referring to FIG. 7, the PMOS transistor formed by using the OSS shows an improvement in an average driving voltage by about 67 mV when compared to the PMOS transistor formed by using the ODS.

Referring to FIG. 8, the PMOS transistor formed by using the OSS shows a decrease of a gate overlapping capacitance value by about 3.65% when compared to the PMOS transistor formed by using the ODS.

As described above, the performance of a transistor having an LDD structure including an OSS structure may be improved compared to transistors having an ODS structure. However, for manufacturing a dynamic random access memory (DRAM), commonly applicable processes for manufacturing a MOS transistor having an LDD structure using an OSS structure may be very complicated.

In particular, when an offset spacer layer is formed on a side wall of a gate electrode and on a substrate in a peripheral region, the offset spacer layer may also be formed on a bit line and on the substrate in a cell region. Since the formation of the offset spacer may not be necessary on the side wall of the bit line in the cell region, the cell region may be covered using a photoresist layer pattern by performing a photolithography process before etching the offset spacer layer anisotropically to form the offset spacer in the peripheral region.

Then, an anisotropic etching process with respect to the offset spacer layer in the peripheral region may be performed to form the spacer on the side wall of the gate electrode. Thereafter, a lightly doped impurity region may be formed and an additional oxide layer spacer may be formed. Then, a highly doped impurity region may be formed.

As described above, an additional photolithography process may be required for selectively covering the cell region before forming the lightly doped impurity region in the peripheral region. In addition, the area of a bottom portion of a contact plug formed between the bit lines may be decreased due to the offset spacer layer that remains on the side wall of the bit line in the cell region.

SUMMARY

Some embodiments provide methods of manufacturing a semiconductor device having a metal oxide semiconductor (MOS) structure including an offset single spacer (OSS).

Methods of manufacturing a semiconductor device according to some embodiments include forming a gate electrode on a semiconductor substrate, the gate electrode having opposing side walls, forming spacers on the side walls of the gate electrode, and doping impurities into the semiconductor substrate on opposing sides of the spacers to form highly doped impurity regions having a first concentration of doping impurities in the semiconductor substrate. The spacers are selectively etched to expose portions of the semiconductor substrate between the highly doped impurity regions and the gate electrode, and lightly doped impurity regions are formed in the exposed portions of the semiconductor substrate between the highly doped impurity regions and the gate electrode. The lightly doped impurity regions have a second concentration of impurities that is lower than the first concentration of impurities.

The methods further include forming side wall oxide spacers by oxidizing the side walls of the gate electrode.

The spacers may include silicon oxide.

The methods may further include forming an offset spacer layer on the side walls of the gate electrode and on an upper surface of the semiconductor substrate. The offset spacer layer may be on the semiconductor substrate between the spacers and the gate electrode, and the methods may further include anisotropically etching the offset spacer layer to form an offset spacer.

The offset spacer layer may include silicon nitride.

Forming the spacers may include forming a spacer layer on the offset spacer layer, and anisotropically etching the spacer layer.

Methods of manufacturing a semiconductor device according to further embodiments include forming a gate electrode in a peripheral region of a semiconductor substrate having a cell region and a peripheral region, forming spacers on opposing side walls of the gate electrode, and doping impurities into the semiconductor substrate adjacent the spacers to form highly doped impurity regions in the semiconductor substrate. The spacers are removed from the side walls of the gate electrode, and lightly doped impurity regions are formed in the substrate on both sides of the gate electrode between the highly doped impurity regions and the gate electrode.

The methods may further include forming an oxide spacer by oxidizing the side wall of the gate electrode.

The spacers may include silicon oxide.

The methods may further include forming an offset spacer layer on an upper surface of the substrate and on the side walls of the gate electrode, and anisotropically etching the offset spacer layer to form offset spacers on the side walls of the gate electrode.

The offset spacer layer may include silicon nitride.

The spacers may be formed by forming a spacer layer on the offset spacer layer, and anisotropically etching the spacer layer.

Portions of the spacer layer formed in the cell region may be removed during anisotropic etching of the spacer layer.

The methods may further include forming a photoresist layer pattern selectively covering the cell region after forming the spacers.

The methods may further include heat treating the substrate to activate the high concentration impurities after forming the highly doped impurity regions.

A conductive layer pattern may be formed as a bit line in the cell region during formation of the gate electrode in the peripheral region.

Forming the spacers may include forming a spacer layer on the offset spacer layer, and anisotropically etching the spacer layer to form first spacers on side walls of the gate electrode and second spacers on side walls of the conductive layer pattern.

The second spacers on the side walls of the conductive layer pattern in the cell region may be removed during removal of the first spacers from the side walls of the gate electrode.

Methods of manufacturing a semiconductor device according to still further embodiments include forming a gate electrode on a semiconductor substrate, forming a spacer on a side wall of the gate electrode, doping impurities into the substrate adjacent the spacer to form a highly doped impurity region having a first concentration of doping impurities, and selectively removing the spacer to expose a portion of the semiconductor substrate between the highly doped impurity region and the gate electrode. A lightly doped impurity region is formed in the exposed portion of the substrate between the highly doped impurity region and the gate electrode. The lightly doped impurity region has a second concentration of impurities that is lower than the first concentration of impurities.

According to some embodiments, a highly doped impurity region may be formed prior to forming a lightly doped impurity region for manufacturing an LDD using an OSS. Since the lightly doped impurity region is formed later, the thickness of a spacer remaining on a side wall of a gate electrode may be reduced. In addition, an overlapping capacitance may be decreased, because the substrate under the bottom portion of the gate electrode and the impurity doped region may not overlap, or an overlapping area thereof may be reduced. Accordingly, a semiconductor device having improved electric characteristics may be manufactured.

For a DRAM device, a transistor having a buried-type gate electrode may be formed in the cell region and a transistor having a planar-type gate electrode may be formed in the peripheral region. When a lightly doped drain (LDD) structure is completed in the peripheral region in accordance with embodiments described herein, a nitride layer used as an offset spacer may not remain in the cell region of the substrate. Therefore, a separate photolithography step for selectively opening the cell region may be omitted. The manufacturing process of the DRAM device may be simplified.

BRIEF DESCRIPTION OF THE DRAWINGS

Example embodiments will be more clearly understood from the following detailed description taken in conjunction with the accompanying drawings. FIGS. 1 to 36 represent example embodiments as described herein.

FIG. 1 is a lightly doped drain (LDD) structure formed by using an offset dual spacer (ODS).

FIG. 2 is an LDD structure formed by using an offset single spacer (OSS).

FIGS. 3 to 5 illustrate graphs for comparing a current, a driving voltage and a gate overlapping capacitance value of each NMOS transistor having an LDD structure formed by using an ODS or an OSS.

FIGS. 6 to 8 illustrate graphs for comparing a current, a driving voltage and a gate overlapping capacitance value of each PMOS transistor having an LDD structure formed by using an ODS or an OSS.

FIG. 11 is a source/drain impurity profile of an NMOS transistor when a lightly doped impurity region is formed prior to a highly doped impurity region for forming an LDD structure in accordance with a general process.

FIG. 12 is a source/drain impurity profile of a PMOS transistor when a lightly doped impurity region is formed prior to a highly doped impurity region for forming an LDD structure in accordance with a general process.

FIG. 13 is a source/drain impurity profile of an NMOS transistor when a highly doped impurity region is formed prior to a lightly doped impurity region for forming an LDD structure using an OSS process in accordance with some embodiments.

FIG. 14 is a source/drain impurity profile of a PMOS transistor when a highly doped impurity region is formed prior to a lightly doped impurity region for forming an LDD structure using an OSS process in accordance with some embodiments.

FIG. 15 illustrates a graph of operating voltage of an NMOS transistor as a function of gate length (Lg) when the NMOS transistor includes an LDD structure obtained by forming a lightly doped impurity region prior to a highly doped impurity region in accordance with a conventional process, and when the NMOS transistor includes an LDD structure obtained by forming a highly doped impurity region prior to a lightly doped impurity region in accordance with some embodiments.

FIG. 16 illustrates a graph of drain induced barrier lowering (DIBL) of an NMOS transistor when the NMOS transistor includes an LDD structure obtained by forming a lightly doped impurity region prior to a highly doped impurity region in accordance with a conventional process, and when the NMOS transistor includes an LDD structure obtained by forming a highly doped impurity region prior to a lightly doped impurity region in accordance with some embodiments.

FIG. 17 illustrates a graph operating voltage of a PMOS transistor as a function of gate length (Lg) when the PMOS transistor includes an LDD structure obtained by forming a lightly doped impurity region prior to a highly doped impurity region in accordance with a conventional process, and when the PMOS transistor includes an LDD structure obtained by forming a highly doped impurity region prior to a lightly doped impurity region in accordance with some embodiments.

FIG. 18 illustrates a graph of drain induced barrier lowering (DIBL) of a PMOS transistor when the PMOS transistor includes an LDD structure obtained by forming a lightly doped impurity region prior to a highly doped impurity region in accordance with a conventional process, and when the PMOS transistor includes an LDD structure obtained by forming a highly doped impurity region prior to a lightly doped impurity region in accordance with some embodiments.

FIG. 19 is a layout diagram of a cell region of a DRAM device.

FIG. 21 is a layout diagram of a peripheral region of a DRAM cell in which a bit line makes a direct contact with an upper surface of a substrate in an active region.

FIG. 22 is a cross-sectional view cut along a line A-A' in FIG. 21.

FIG. 24 is a cross-sectional view of a peripheral region of a DRAM cell in which a bit line is electrically connected with a substrate through a contact plug in an active region without making a direct contact with an upper surface of the substrate.

FIGS. 25 to 34 are cross-sectional views for explaining a method of manufacturing a DRAM device in accordance with some embodiments.

FIG. 35 is a block diagram illustrating a system employing a DRAM device manufactured in accordance with some embodiments.

FIG. 36 is a block diagram illustrating a portable device employing a DRAM device manufactured in accordance with further embodiments.

DETAILED DESCRIPTION OF THE EMBODIMENTS

Figure 1:
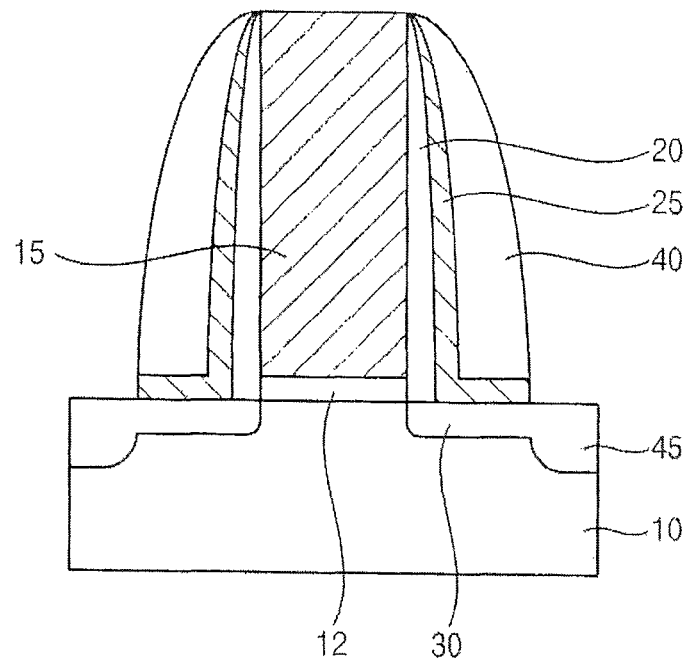
Figure 2:
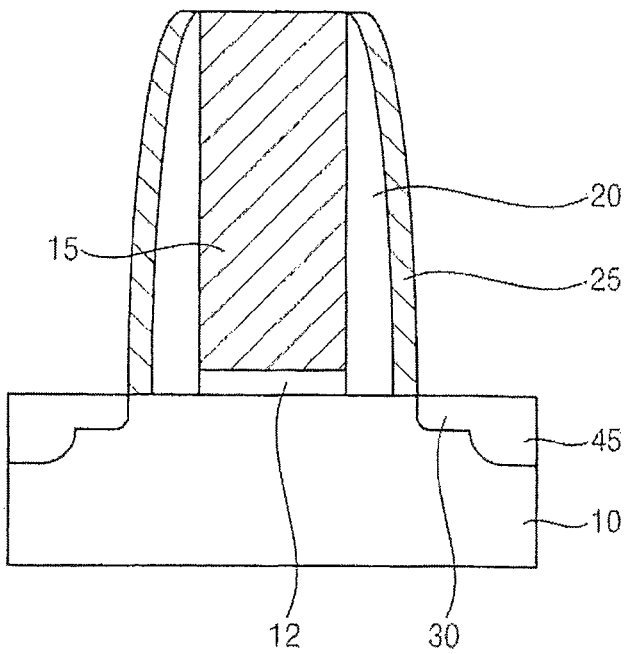
Figure 3:
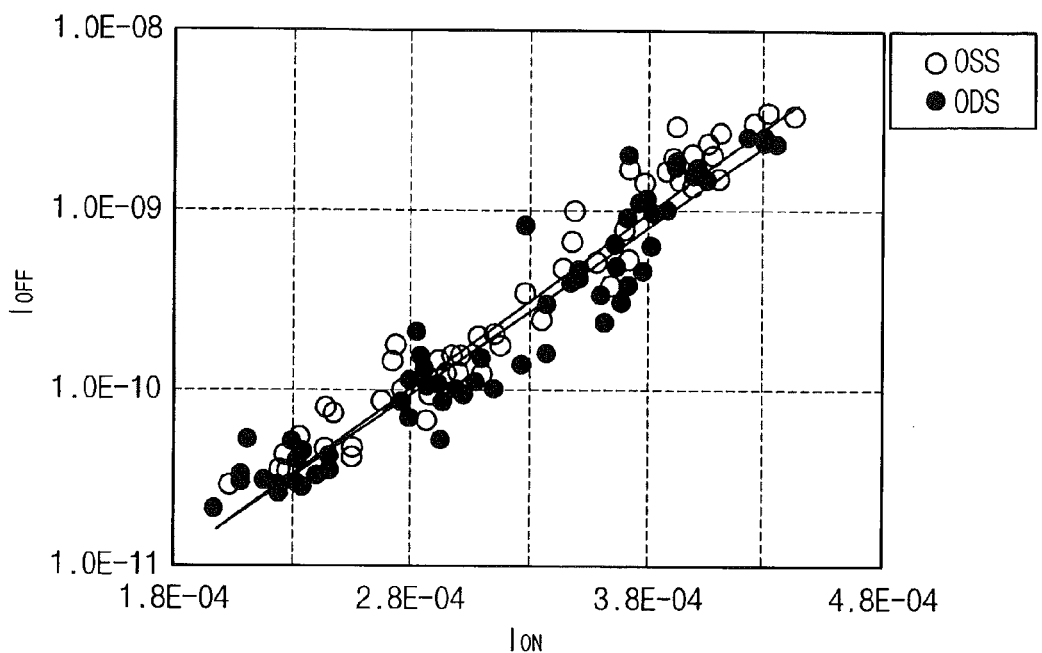
Figure 4:
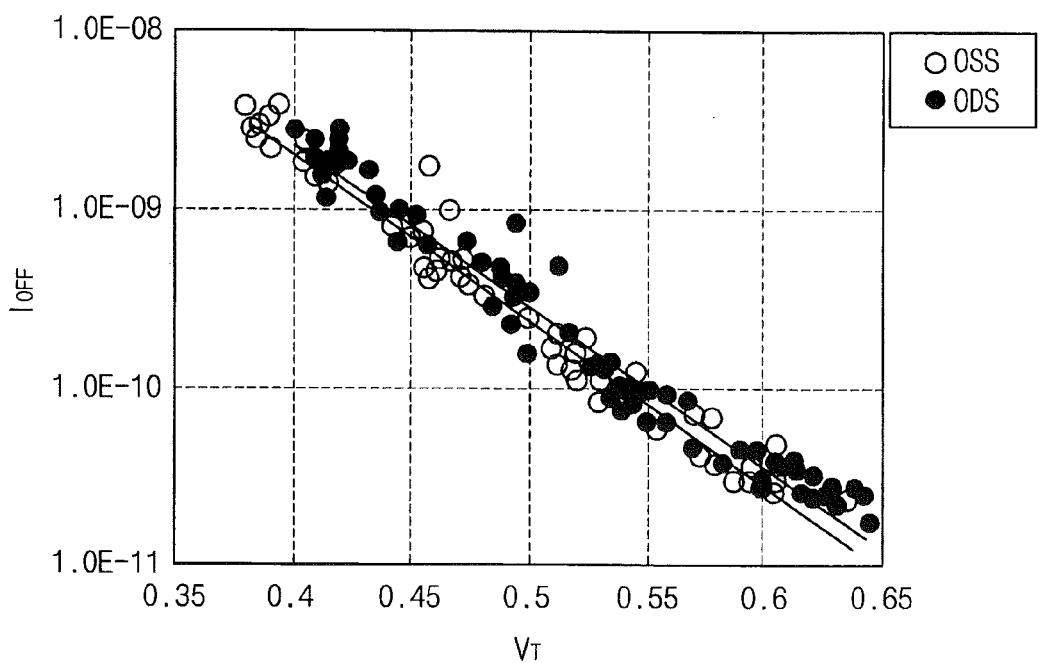
Figure 5:
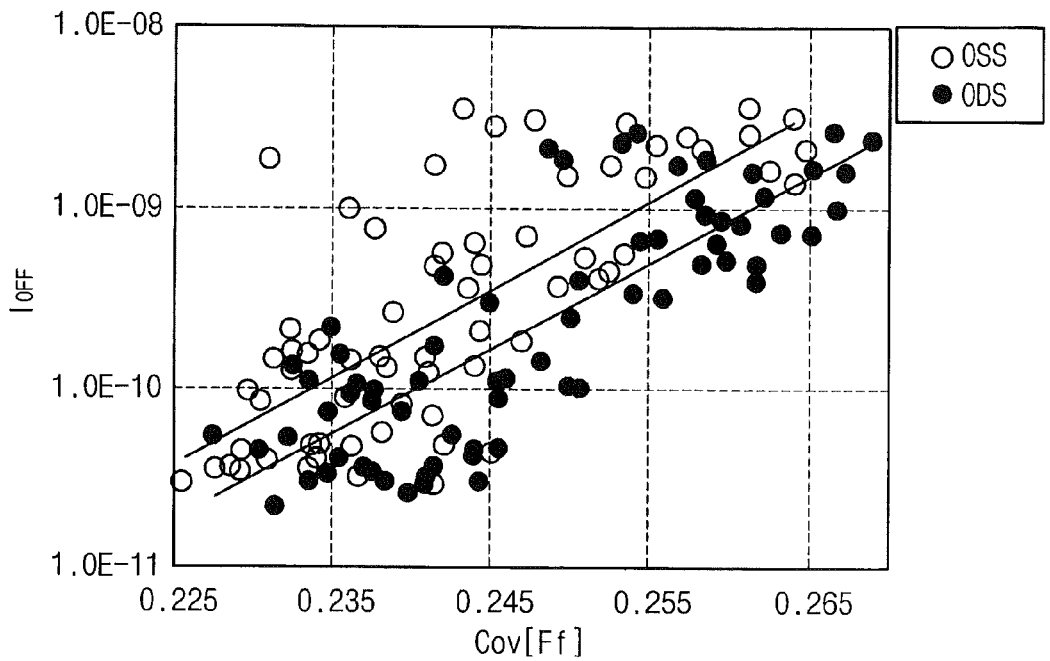
Figure 6:
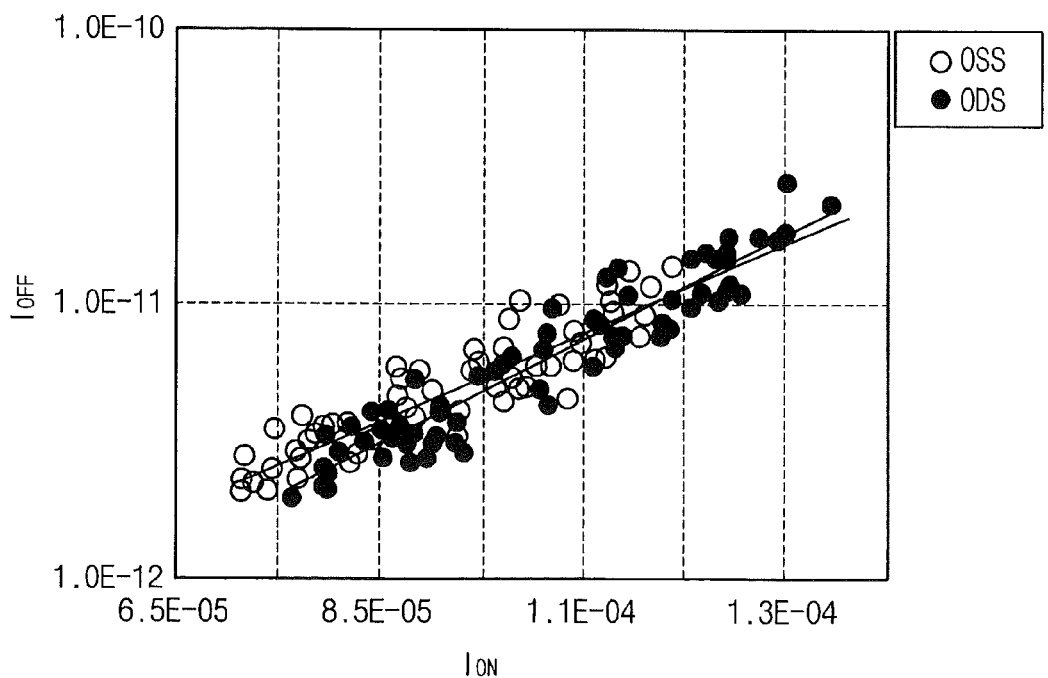
Figure 7:
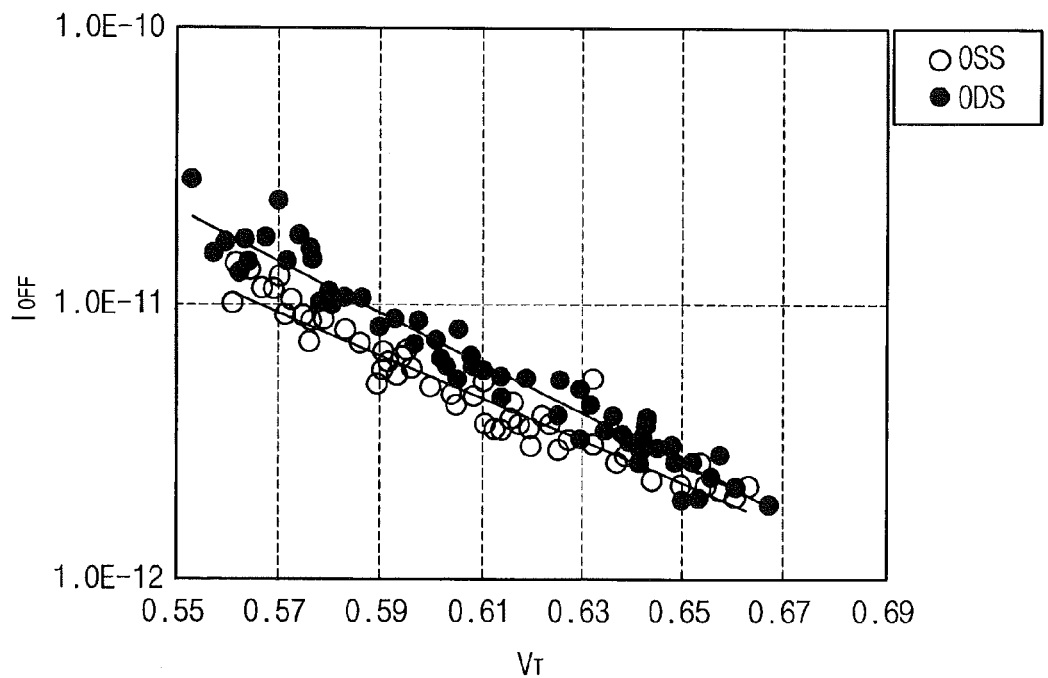
Figure 8:
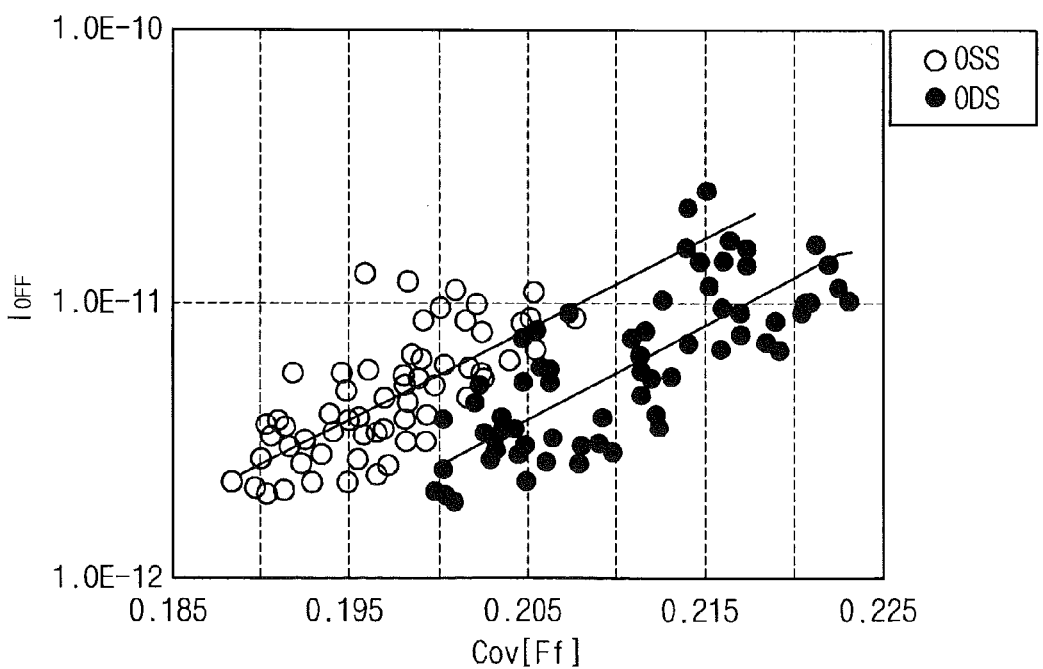

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, example embodiments on methods of manufacturing recess channel transistors will be explained in detail.

FIGS. 9A to 9D are cross-sectional views for explaining a forming method of an LDD structure using an OSS in accordance with an example embodiment.

In accordance with this example embodiment, a highly doped impurity region may be formed before forming a lightly doped impurity region when an impurity doped region of a transistor is formed. Hereinafter, a method of manufacturing an impurity doped region of a planar transistor in a peripheral region of a DRAM device including a buried channel array transistor (BCAT) in each memory cell will be described. The DRAM device may have a structure in which an electrode provided as a bit line may make contact with a semiconductor substrate.

Figure 9A:
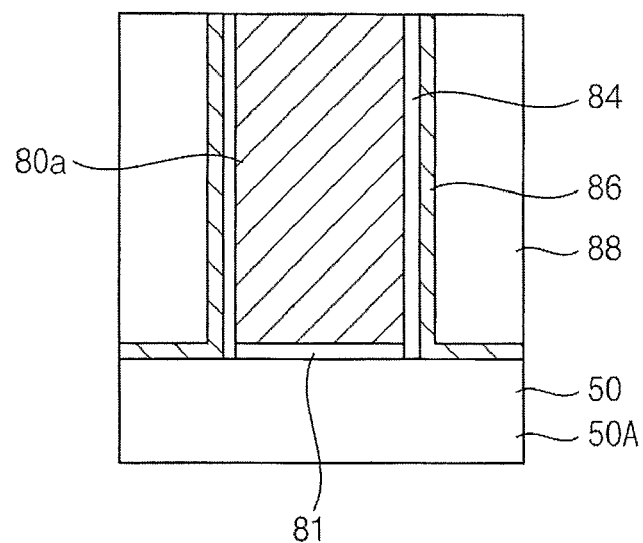
FIGS. 9A to 9D are cross-sectional views for explaining a forming method of an LDD structure using an OSS in accordance with some embodiments.
Figure 9B:
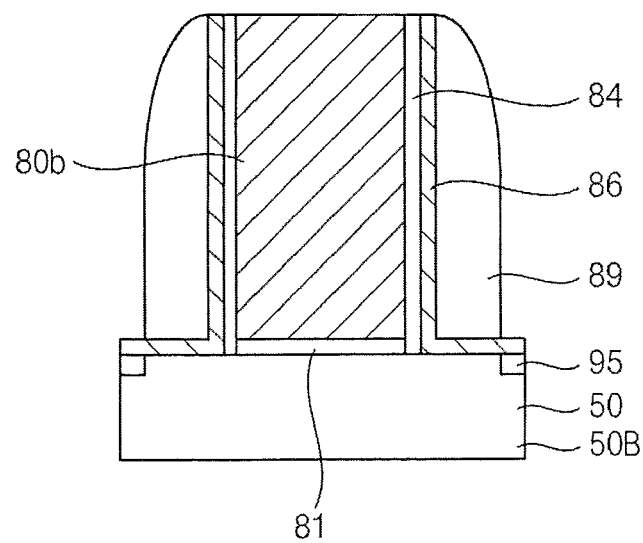
Figure 9C:
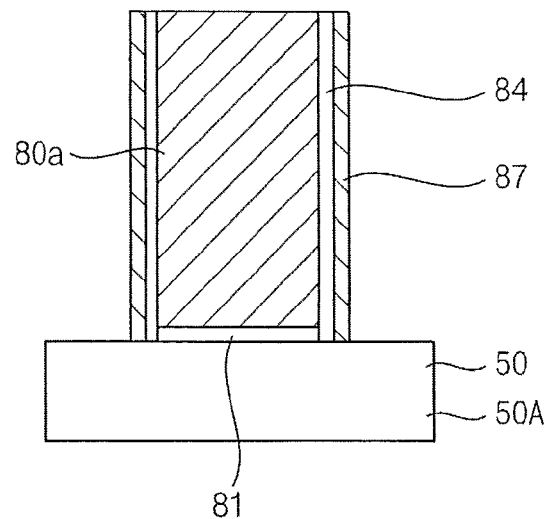
Figure 9D:
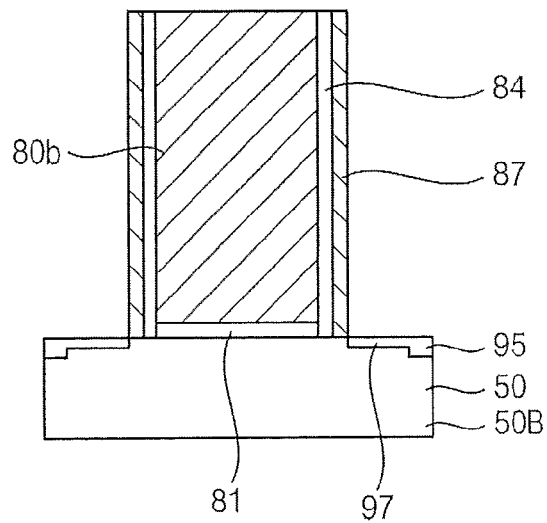

FIGS. 9A and 9C illustrate a portion of a memory cell region and FIGS. 9B and 9D illustrate a portion of a peripheral region.

Referring to FIGS. 9A and 9B, an electrode 80a (will be called 'GBL') may be formed as a bit line in an active region 50 of a cell region 50A of a semiconductor substrate. A gate electrode 80b including a gate oxide layer 81 may be formed in the active region 50 of a peripheral region 50B of the semiconductor substrate.

A first oxide layer spacer 84 may be formed on a side wall of the GBL 80a in the cell region 50A. An offset nitride layer 86 may be formed on a surface of the first oxide layer spacer 84 and on the substrate. A second oxide layer 88 may be formed by performing an overall deposition process on the offset nitride layer 86.

The same processes explained above may be performed with respect to the peripheral region 50B to form a first oxide layer spacer 84 on a side wall of the gate electrode 80b. An offset nitride layer 86 may be formed on a surface of the first oxide layer spacer 84 and on the substrate. A second oxide layer 88 may be formed by performing an overall deposition process on the offset nitride layer 86.

Since a buried channel array transistor is formed in the cell region 50A, an impurity doped region may not need to be formed in the cell region 50A of the substrate. Therefore, a photoresist pattern (not shown) selectively covering the cell region 50A may be formed on the second oxide layer 88.

The second oxide layer 88 may be anisotropically etched to form a second oxide spacer 89 on a side wall of the gate electrode 80b formed in the peripheral region 50B. In this case, since the cell region 50A is covered with the photoresist pattern, the second oxide layer formed in the cell region 50A may not be etched. After forming the second oxide layer spacer 89, a highly doped impurity region 95 may be formed in the semiconductor substrate. Then, a heat treatment may be performed to activate the high concentration impurities.

Referring to FIGS. 9C and 9D, the highly doped impurity region 95 may be formed in the peripheral region 50B and then, the photoresist layer pattern (not shown) covering the cell region 50A may be removed. The second oxide layer 88 and the second oxide layer spacer 89 may be removed through an etching process.

Thereafter, the offset nitride layer 86 may be anisotropically etched. A nitride layer spacer 87 may be formed on a side wall of the GBL 80a in the cell region 50A and on a side wall of the gate electrode 80b in the peripheral region 50B, respectively. The nitride layer spacer 87 may be provided as an offset spacer, i.e. an ion doping mask for forming a lightly doped impurity region.

Low concentration impurity ions may be doped into the peripheral region 50B to form a lightly doped impurity region 97.

In accordance with this example embodiment, the overlap of an underlying substrate portion of the bottom portion of the gate electrode and the impurity doped region may be restrained to improve an overlapping capacitance.

FIGS. 10A to 10D are cross-sectional views for explaining methods of forming an LDD structure using an OSS in accordance with further embodiments.

Hereinafter, methods of manufacturing an impurity doped region of a planar transistor in a peripheral region of a DRAM device including a BCAT in each memory cell will be described. The DRAM device may have a structure in which an electrode provided as a bit line may not make contact with a semiconductor substrate.

Figure 10A:
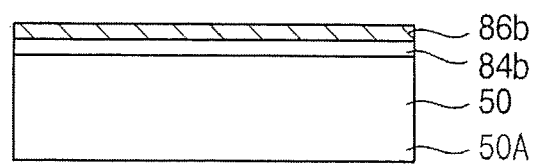
FIGS. 10A to 10D are cross-sectional views for explaining a forming method of an LDD structure using an OSS in accordance with further embodiments.
Figure 10B:
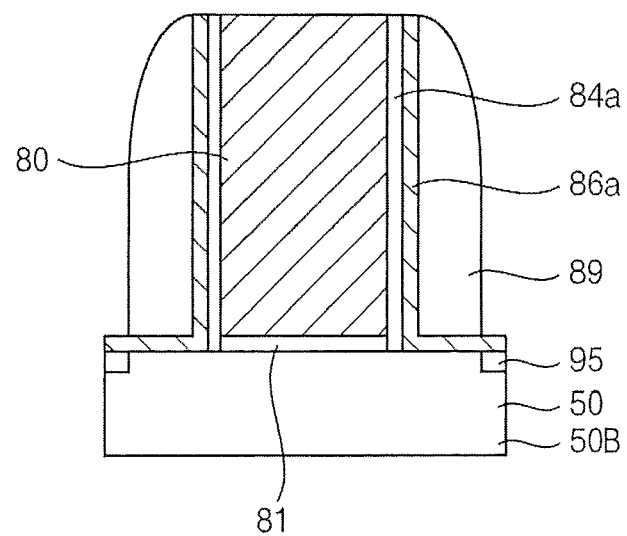
Figure 10C:
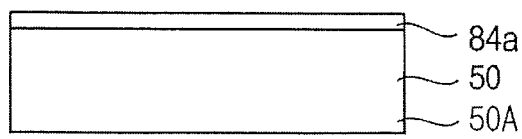
Figure 10D:
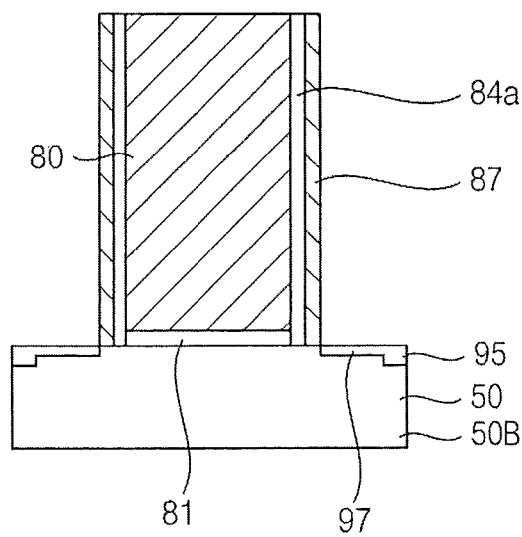

FIGS. 10A and 10C illustrate a portion of a memory cell region 50A and FIGS. 10B and 10D illustrate a portion of a peripheral region 50B.

Referring to FIGS. 10A and 10B, a gate electrode 80 may be formed in an active region in a peripheral region 50B of a semiconductor substrate. In accordance with this example embodiment, an electrode provided as a bit line may not be formed in the active region in the cell region 50A of the semiconductor substrate. Accordingly, spacers may not be formed in the cell region 50A.

A first oxide layer spacer 84a may be formed on a side wall of the gate electrode 80. At the same time, a first oxide layer 84b may be formed in the cell region 50A of the substrate during a process for forming the first oxide layer spacer 84a.

An offset nitride layer 86a for forming an offset spacer may be formed on the first oxide layer spacer 84a. A first nitride layer 86b may be formed in the cell region 50A of the substrate.

On the offset nitride layer 86a and the first nitride layer 86b, a second oxide layer (not shown) may be deposited. The second oxide layer may be anisotropically etched to form a second oxide layer spacer 89. During performing an anisotropic etching process, the second oxide layer in the cell region 50A of the substrate may be removed.

A photoresist layer pattern (not shown) selectively covering the cell region may be formed and high concentration impurities may be doped into the peripheral region of the substrate. A highly doped impurity region 95 may be formed in the peripheral region of the substrate. Then, a heat treatment to activate the high concentration impurities may be performed. After completing the high doping process in the peripheral region, the photoresist layer pattern formed in the cell region may be removed.

Referring to FIGS. 10C and 10D, the second oxide layer spacer 89 formed in the peripheral region may be removed.

The offset nitride layer 86a may be anisotropically etched to form a nitride layer spacer 87. The first nitride layer 86b formed in the cell region may be removed by an anisotropic etching process. The nitride spacer 87 formed in the peripheral region may be provided as an offset spacer.

Low concentration impurity ions may be doped into the peripheral region to form a lightly doped impurity region 97.

In accordance with this example embodiment, an overlap of the lightly doped impurity region 97 with a bottom portion of the gate electrode 80 adjacent the substrate may be reduced so that an overlapping capacitance between the lightly doped impurity region 97 and the bottom portion of the gate electrode 80 may be reduced. In addition, the short channel effect may be reduced in such a structure.

When the highly doped impurity region is formed before the lightly doped impurity region, the second oxide layer spacer in the peripheral region may be removed after completing the formation of the highly doped impurity region. Accordingly, the oxide layer in the cell region may be removed during a process used to remove the second oxide layer spacer in the peripheral region. Therefore, a separate photolithography process for opening only the cell region may not be necessary so that a manufacturing process may be simplified.

Figure 11:
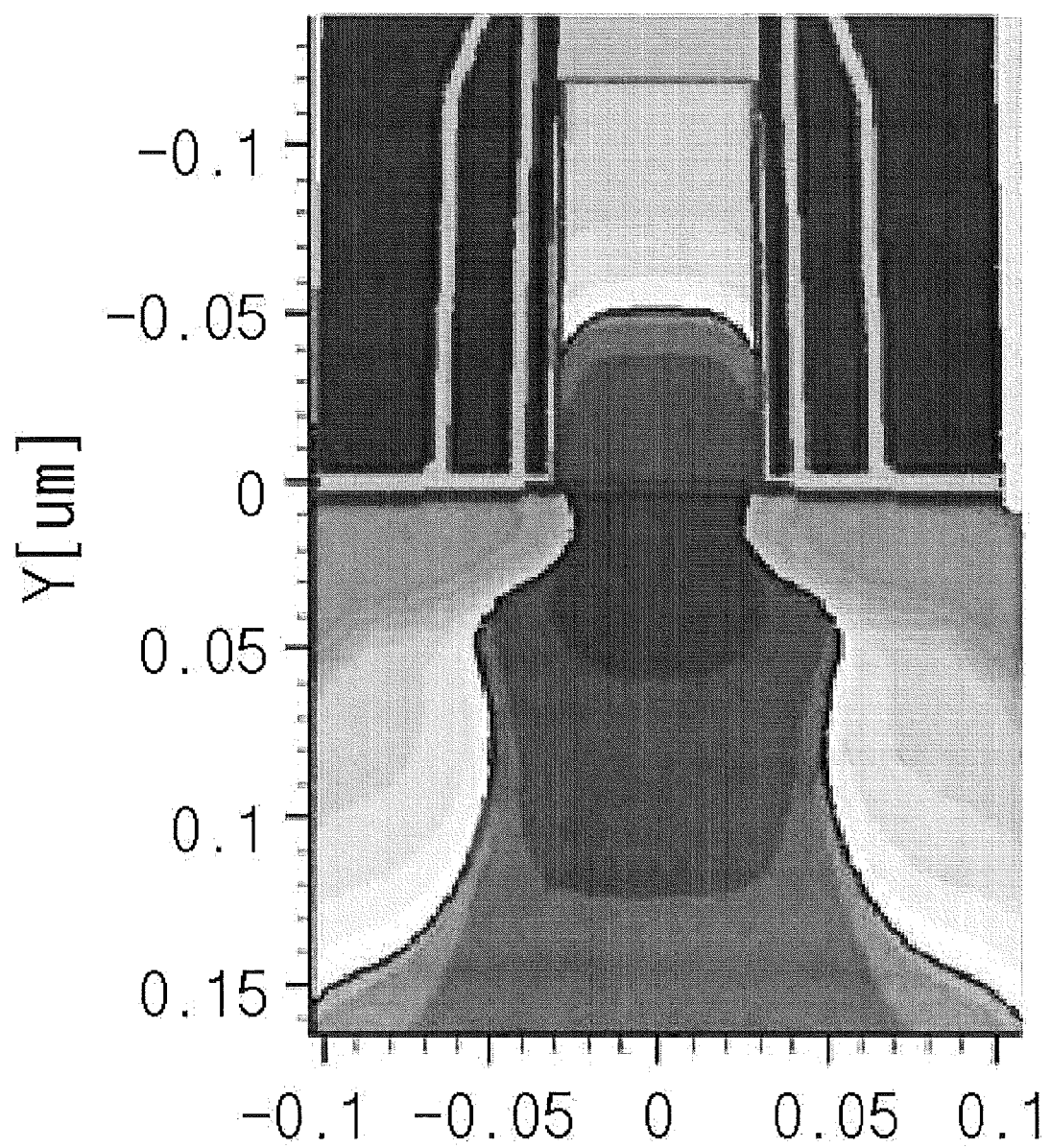

FIG. 11 is a source/drain impurity profile of an NMOS transistor when a lightly doped impurity region is formed prior to a highly doped impurity region for forming an LDD structure in accordance with a conventional process.

Figure 12:
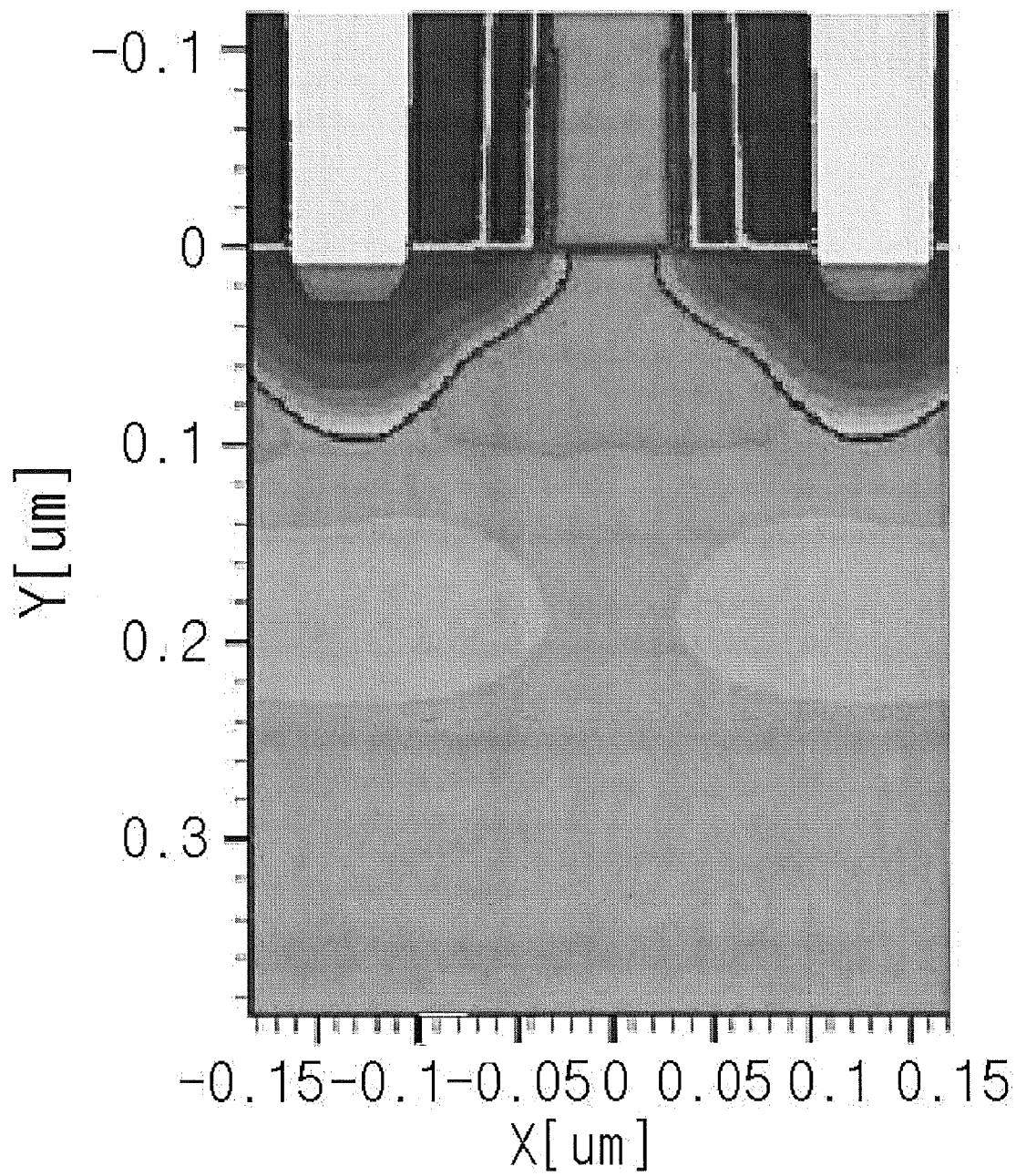

FIG. 12 is a source/drain impurity profile of a PMOS transistor when a lightly doped impurity region is formed prior to a highly doped impurity region for forming an LDD structure in accordance with a conventional process.

Figure 13:
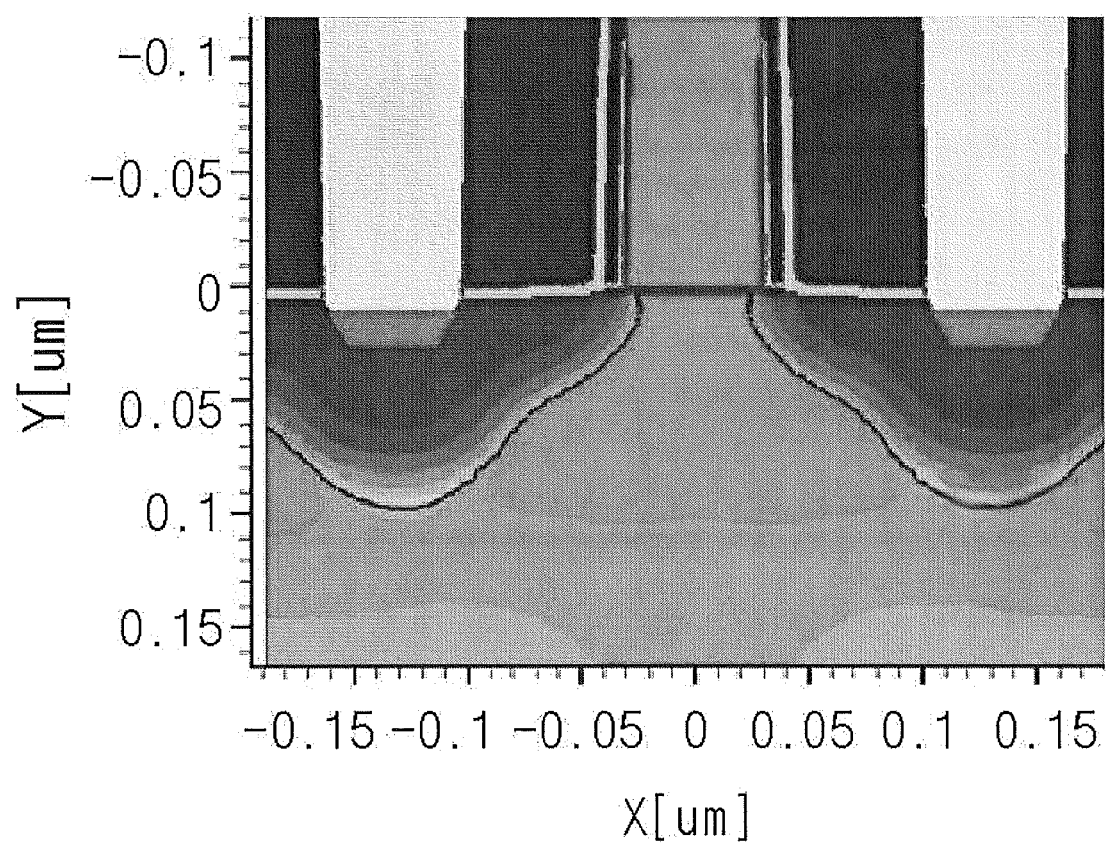

FIG. 13 is a source/drain impurity profile of an NMOS transistor when a highly doped impurity region is formed prior to a lightly doped impurity region for forming an LDD structure using an OSS process in accordance with an example embodiment.

Figure 14:
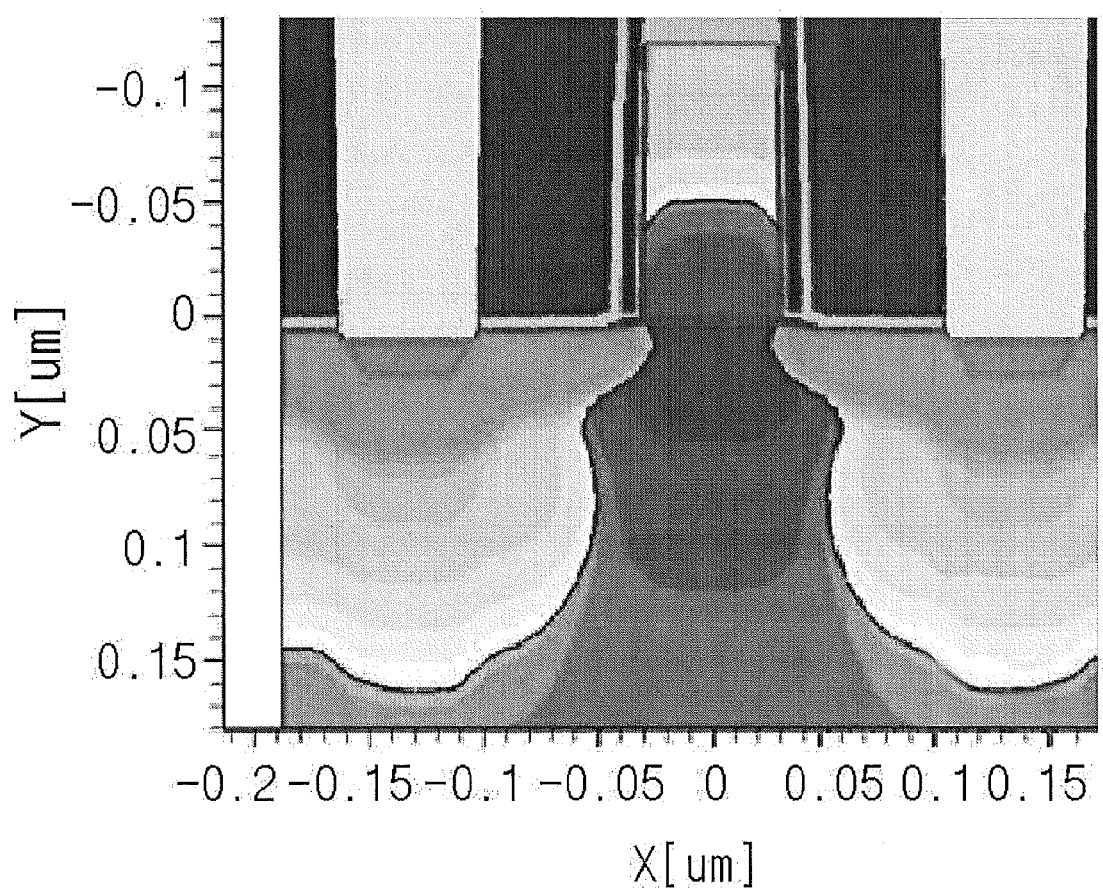

FIG. 14 is a source/drain impurity profile of a PMOS transistor when a highly doped impurity region is formed prior to a lightly doped impurity region for forming an LDD structure using an OSS process in accordance with example embodiment.

Referring to FIGS. 11 to 14, according to the impurity profiles, a thinner junction may be obtained in a transistor including an LDD structure obtained through processes for forming a highly doped impurity region, removing a spacer and then forming a lightly doped impurity region (refer to FIGS. 13 and 14) when compared to a transistor including an LDD structure obtained in accordance with the conventional process. In addition, an impurity junction may not be overlapped with a portion of the substrate facing the bottom portion of the gate electrode, and an overlapping capacitance (Cov) may be improved in a transistor including the LDD structure obtained by forming a highly doped impurity region, removing a spacer and then forming a lightly doped impurity region (refer to FIGS. 13 and 14).

Figure 15:
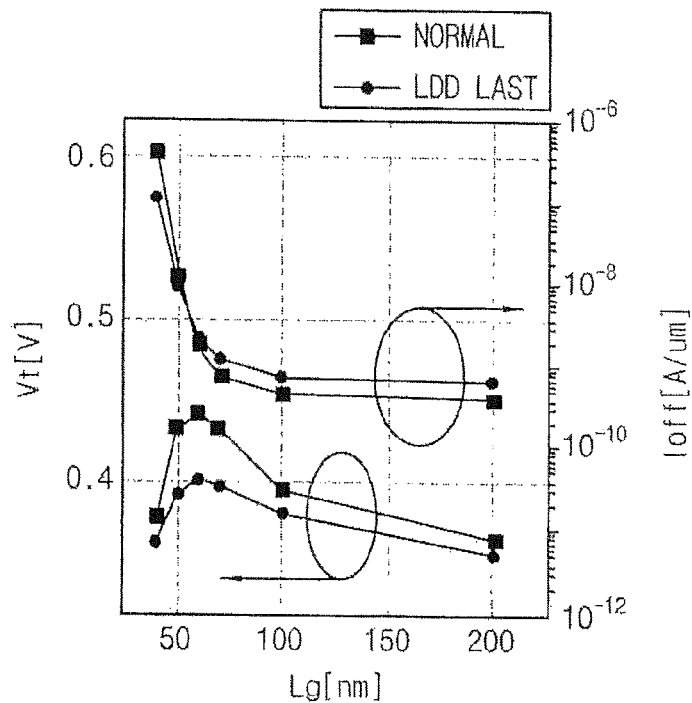

FIG. 15 illustrates a graph of Lg scale down and an operating voltage of an NMOS transistor when the NMOS transistor includes an LDD structure obtained by forming a lightly doped impurity region prior to a highly doped impurity region in accordance with a conventional process, and when the NMOS transistor includes an LDD structure obtained by forming a highly doped impurity region prior to a lightly doped impurity region in accordance with an example embodiment.

Figure 16:
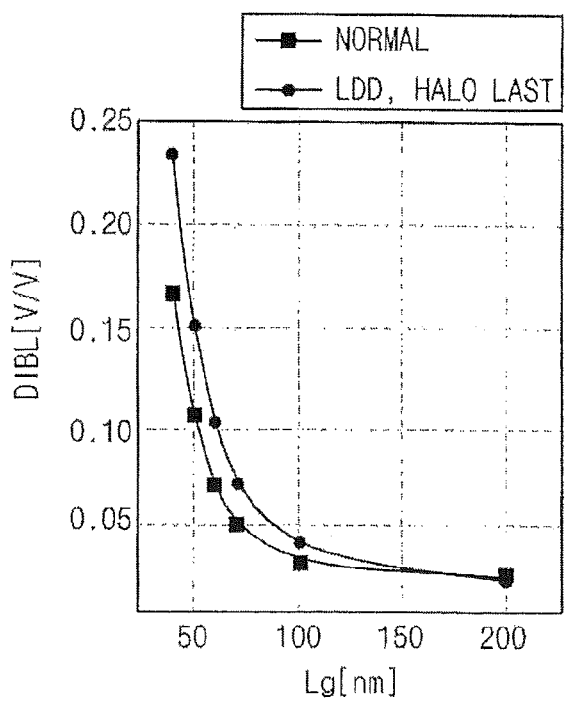

FIG. 16 illustrates a graph of drain induced barrier lowering (DIBL) of an NMOS transistor when the NMOS transistor includes an LDD structure obtained by forming a lightly doped impurity region prior to a highly doped impurity region in accordance with a conventional process, and when the NMOS transistor includes an LDD structure obtained by forming a highly doped impurity region prior to a lightly doped impurity region in accordance with an example embodiment.

Figure 17:
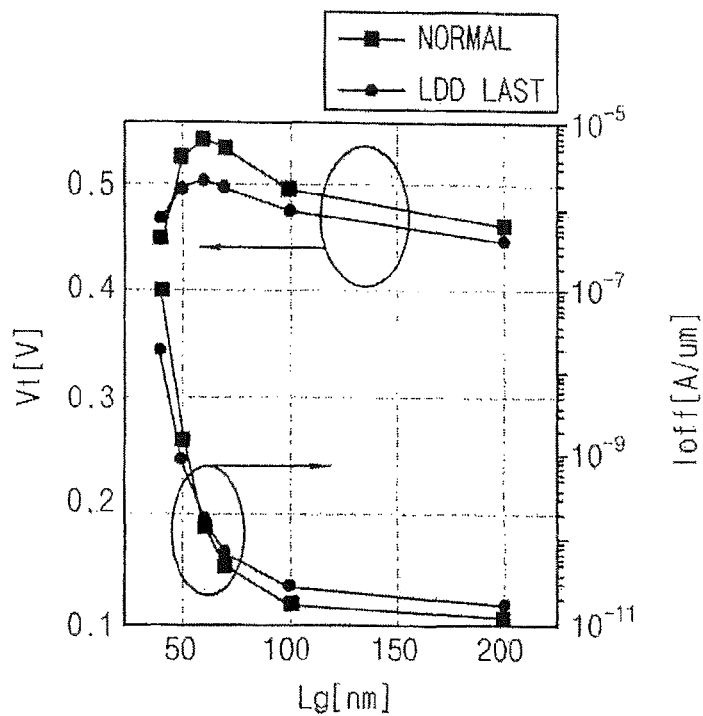

FIG. 17 illustrates a graph of Lg scale down and an operating voltage of a PMOS transistor when the PMOS transistor includes an LDD structure obtained by forming a lightly doped impurity region prior to a highly doped impurity region in accordance with a conventional process, and when the PMOS transistor includes an LDD structure obtained by forming a highly doped impurity region prior to a lightly doped impurity region in accordance with an example embodiment.

Figure 18:
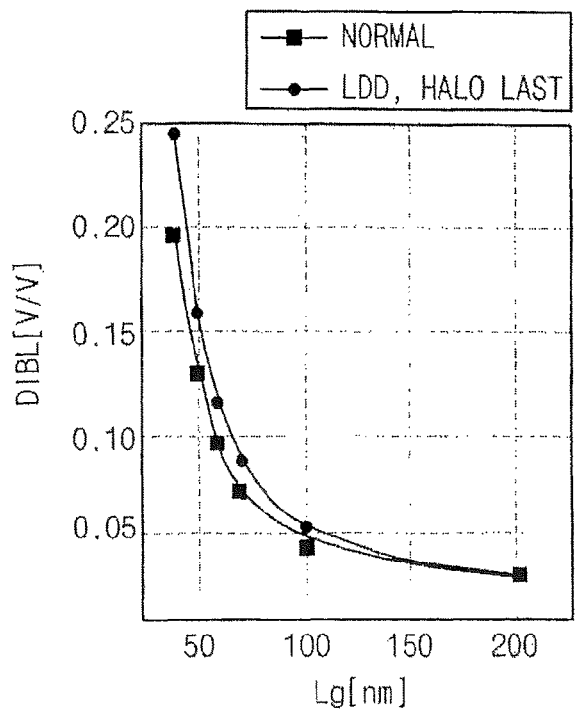

FIG. 18 illustrates a graph of drain induced barrier lowering (DIBL) of a PMOS transistor when the PMOS transistor includes an LDD structure obtained by forming a lightly doped impurity region prior to a highly doped impurity region in accordance with a conventional process, and when the PMOS transistor includes an LDD structure obtained by forming a highly doped impurity region prior to a lightly doped impurity region in accordance with an example embodiment.

Referring to FIGS. 15 and 17, the operating voltage may be reduced for the NMOS transistor and the PMOS transistor when the LDD structure was formed by forming a highly doped impurity region before forming the lightly doped impurity region. Referring to FIGS. 16 and 18, the DIBL may be reduced and the electric characteristic may be improved for the NMOS transistor and the PMOS transistor when the LDD structure was formed by forming a highly doped impurity region before forming the lightly doped impurity region.

Through forming the LDD structure using the OSS and forming the highly doped impurity region prior to the lightly doped impurity region, a transistor having a good electric characteristic may be obtained in accordance with this example embodiment.

Figure 19:
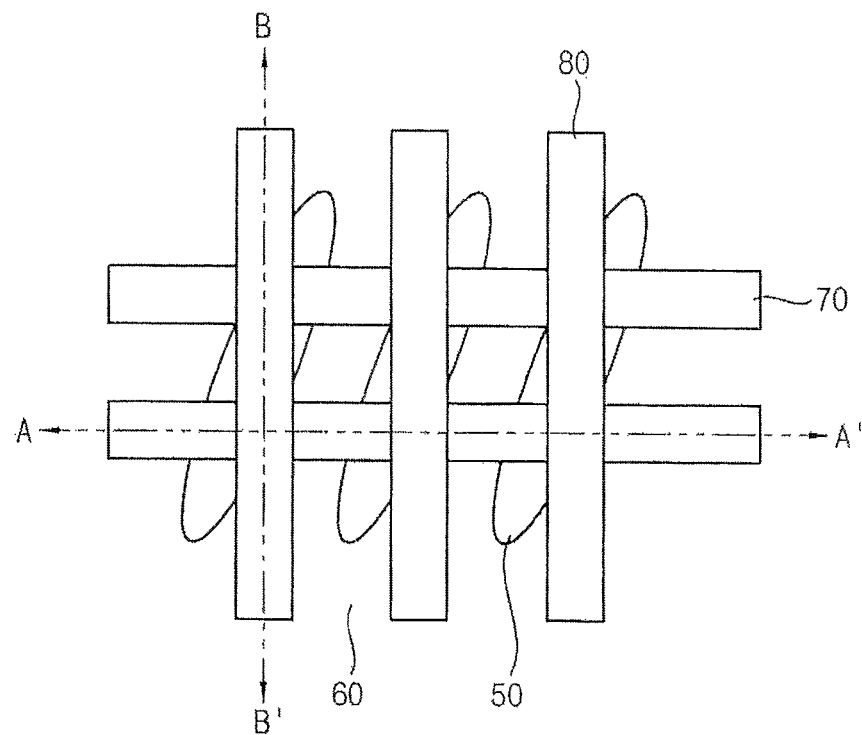

FIG. 19 is a layout diagram of a cell region of a DRAM device.

Particularly, FIG. 19 is a layout diagram of the cell region of the DRAM device including a buried channel array transistor.

Referring to FIG. 19, a plurality of active regions 50 having an isolated shape may be provided. Buried-type gate electrodes 70 may extend in a first direction in the active regions 50. Bit lines (GBL) 80 may extend in a second direction perpendicular to the buried-type gate electrodes 70. The remaining region excluding the active regions may be a device isolation region 60.

The DRAM device illustrated in FIG. 19 may have a structure in which the bit line 80 may make a direct contact with an upper surface of the substrate or have a structure in which the bit line 80 may not make a direct contact with the upper surface of the substrate but be electrically connected with the substrate through a contact plug. That is, the above-described two structures may have the layout diagram illustrated in FIG. 19.

Figure 20A:
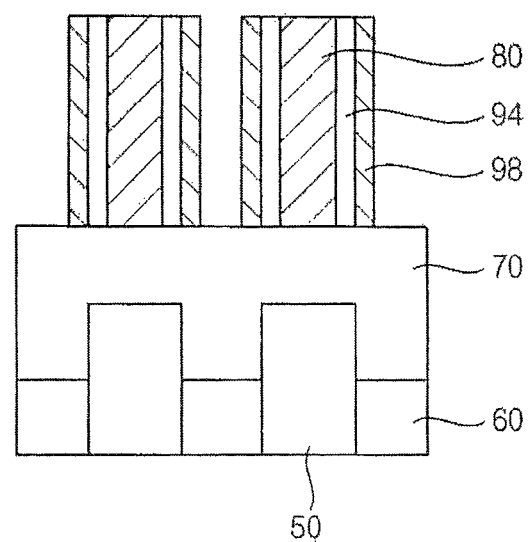
FIGS. 20A and 20B are cross-sectional views of a cell region of a DRAM cell in which a bit line makes a direct contact with an upper surface of a substrate in an active region.
Figure 20B:
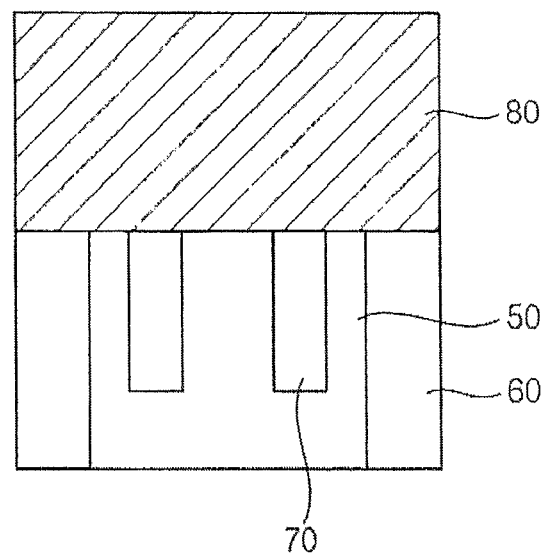

FIGS. 20A and 20B are cross-sectional views of a cell region of a DRAM cell in which a bit line makes a direct contact with an upper surface of a substrate in an active region.

FIG. 20A is a cross-sectional view of the cell region obtained by cutting along a line A-A' in the layout diagram in FIG. 19. FIG. 20B is a cross-sectional view of a cell region obtained by cutting along a line B-B' in the layout diagram in FIG. 19.

Referring to FIGS. 20A and 20B, a substrate separately including an active region 50 and a device isolation region 60 may be formed. In the active region 50 and the device isolation region 60, a buried-type gate electrode 70 may be formed in the first direction. The buried-type gate electrode 70 may be positioned in a trench formed in the active region 50 and the device isolation region 60 and extend in the first direction. The buried-type gate electrode 70 may not protrude from the upper surface of the substrate in the active region 50 but may be buried within the substrate.

A pair of the buried-type gate electrodes 70 in the active region 50 may have an isolated shape surrounded by the device isolation region 60. In addition, a bit line 80 may be on the substrate including the buried gate electrode 70.

On the buried-type gate electrode 70 and on the surface of the substrate, the bit line 80 that extends in a second direction perpendicular to the first direction may be formed. On a side wall of the bit line 80, an oxide layer spacer 94 and a nitride layer spacer 98 may be provided. The nitride layer spacer 98 may be provided as an offset spacer for forming a lightly doped impurity region.

Figure 21:
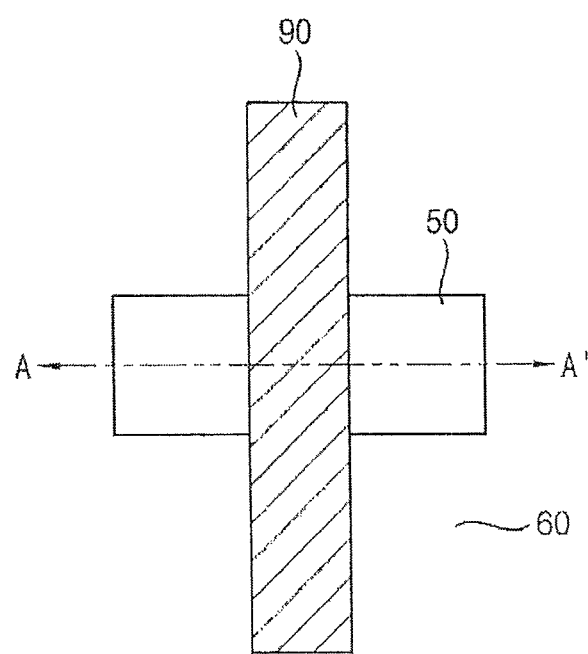

FIG. 21 is a layout diagram of a peripheral region of a DRAM cell in which a bit line makes a direct contact with an upper surface of a substrate in an active region 50.

Referring to FIG. 21, a planar-type gate electrode 90 may be formed in an active region 50 of the peripheral region. The planar-type gate electrode 90 may be formed in accordance with the same process for forming the bit line in the cell region.

Figure 22:
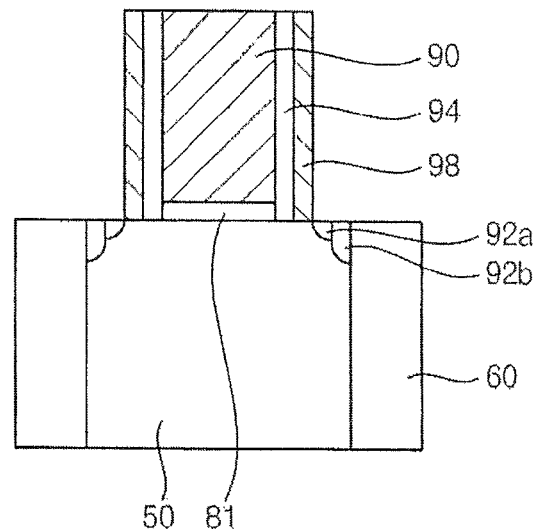

FIG. 22 is a cross-sectional view cut along a line A-A' in FIG. 21.

Referring to FIG. 22, a planar-type gate electrode 90 may be formed in an active region 50 and an oxide layer spacer 94 and a nitride layer spacer 98 provided as an offset spacer may be formed on a side wall of the gate electrode 90.

In the substrate at both sides of the planar-type gate electrode 90, an LDD structure including a lightly doped impurity region 92a and a highly doped impurity region 92b may be formed.

Figure 23A:
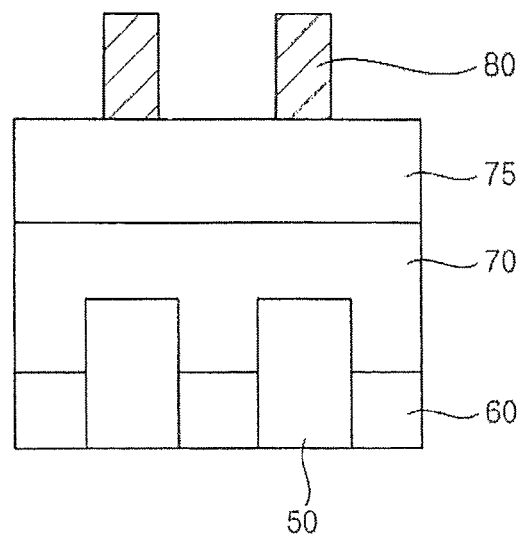
FIGS. 23A and 23B are cross-sectional views of a cell region of a DRAM cell in which a bit line is electrically connected with a substrate through a contact plug in an active region without making a direct contact with an upper surface the a substrate.
Figure 23B:
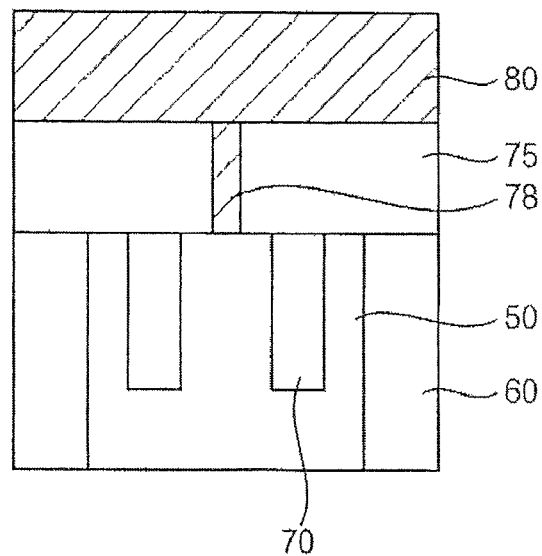

FIGS. 23A and 23B are cross-sectional views of a cell region of a DRAM cell in which a bit line is electrically connected with the substrate through a contact plug in an active region without making a direct contact with an upper surface of a substrate.

FIG. 23A is a cross-sectional view of the cell region obtained by cutting along a line A-A' in the layout diagram in FIG. 19. FIG. 23B is a cross-sectional view of a cell region obtained by cutting along a line B-B' in the layout diagram in FIG. 19.

Referring to FIGS. 23A and 23B, an insulating interlayer 75 and a contact plug 78 may be further included between the substrate 60 and the bit line 80 when compared to the structure illustrated in FIGS. 20A and 20B. The bit line 80 formed on the insulating interlayer 75 may be electrically connected with an active region of the substrate through the contact plug 78.

The bit line 80 may be formed after forming the contact plug 78. Therefore, a spacer having the same structure formed on the side wall of the gate electrode in the peripheral region may not be obtained on the bit line 80. On the side wall of the bit line, spacers are not shown in FIGS. 23A and 23B. However, the spacers may be separately formed on the side wall of the bit line in order to facilitate the performance of following processes.

Figure 24:
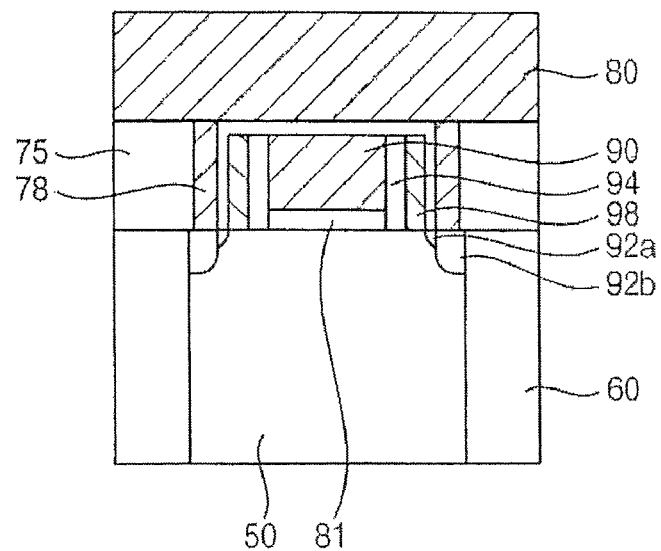

FIG. 24 is a cross-sectional view of a peripheral region of a DRAM cell in which a bit line is electrically connected with the substrate through a contact plug in an active region without making a direct contact with an upper surface of a substrate.

Referring to FIG. 24, a planar-type gate electrode 90 may be formed in an active region 50 surrounded by a device isolation region 60. On the side wall of the planar-type gate electrode 90, an oxide layer spacer 94 and a nitride layer spacer 98 may be formed as an offset spacer.

In the substrate at both sides of the planar-type gate electrode 90, an LDD structure including a lightly doped impurity region 92a and a highly doped impurity region 92b may be formed.

In addition, an insulating interlayer 75 covering the gate electrode 90 may be formed and a contact plug 78 penetrating the insulating interlayer 75 and making contact with the highly doped impurity region 92b of the substrate may be formed. On the insulating interlayer 75, a bit line 80 making contact with the contact plug 78 may be formed.

When a DRAM device is manufactured, an LDD structure may be formed by forming a highly doped impurity region and then a lightly doped impurity region using an OSS. Accordingly, a transistor having a good electric characteristic may be manufactured and so the electric characteristic of the DRAM device may be also improved.

FIGS. 25 to 34 are cross-sectional views for explaining a method of manufacturing a DRAM device in accordance with an example embodiment.

The DRAM device may include a buried channel array transistor and a bit line making contact with a substrate.

Figure 25:
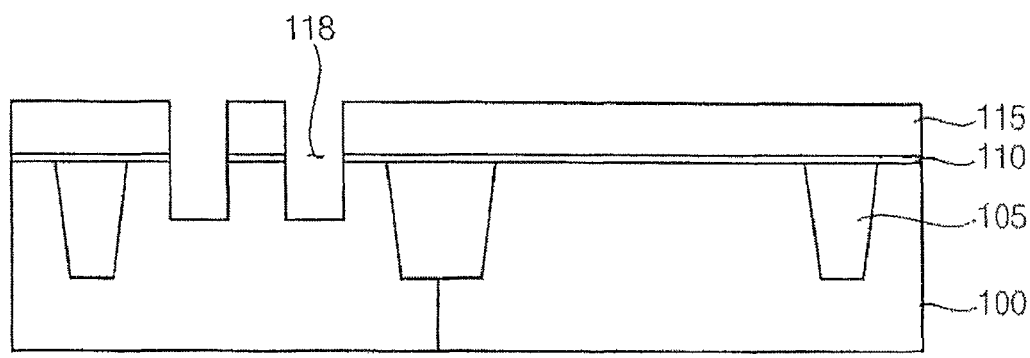

Referring to FIG. 25, a device isolation layer 105 may be formed in a semiconductor substrate 100 to divide the substrate 100 into an active region and a device isolation region.

The device isolation layer 105 may be formed by means of a shallow trench isolation (STI) process. In some embodiments, the device isolation layer 105 may be obtained by forming a trench, forming a thermal oxidation layer, forming a liner using a nitride layer, filling up the trench by using a chemical vapor deposition (CVD) process or a high density plasma-CVD (HDP-CVD) process and then planarizing.

A pad oxide layer 110 may be formed on the semiconductor substrate 100. The pad oxide layer 110 may be formed by a thermal oxidation process and may have a thickness of about 50 Angstroms to about 150 Angstroms.

A hard mask layer (not shown) may be formed on the pad oxide layer 110. The hard mask layer may be formed by using a material having a different etching ratio with that of the semiconductor substrate 100 and the pad oxide layer 110. For example, a silicon nitride layer may be used.

On the hard mask layer, an etching mask pattern (not shown) may be formed as a mask for patterning the hard mask layer. The etching mask pattern may be formed using a plurality of material layers. For example, a process for forming the etching mask pattern, a lower layer may be formed using a plasma CVD oxide layer to a thickness of about 2,000 Angstroms to about 3,000 Angstroms. An interlayer may be formed using an amorphous carbon layer (ACL) as an organic layer to a thickness of about 2,000 Angstroms to about 3,000 Angstroms. An upper layer may be formed using a nitride layer as an anti-reflective layer (ARL) to a thickness of about 500 Angstroms. Then, the integrated layers may be patterned to obtain the etching mask pattern.

The hard mask layer may be etched using the etching mask pattern to form a first hard mask pattern 115. After completing the etching process, the etching mask pattern may be removed.

The substrate in the active region may be etched using the first hard mask pattern 115 as an etching mask to form a recess hole 118. The recess hole 118 may be a space for forming a buried-type gate electrode.

Figure 26:
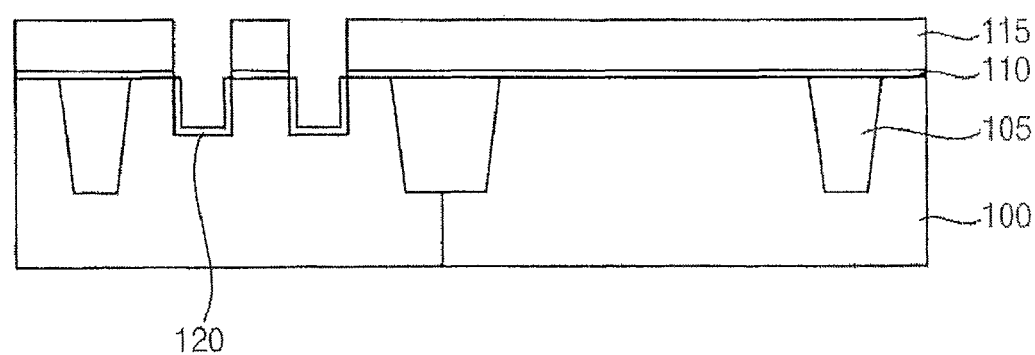

Referring to FIG. 26, after cleaning the semiconductor substrate 100, a first gate dielectric layer 120 may be formed in the space of the recess hole 118.

The first gate dielectric layer 120 may be formed using a hafnium oxide ($HfO_2$) layer, a tantalum oxide ($Ta_2O_5$) layer, a metal oxide layer applicable with a metal gate electrode, etc. The metal oxide layer applicable as the first gate dielectric layer 120 may be selected considering the gate electrode material and electric characteristics required for a transistor in the cell region.

Figure 27:
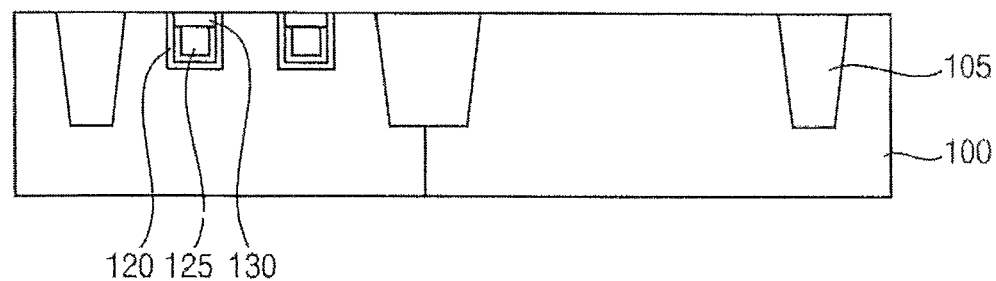

Referring to FIG. 27, a first gate electrode 125 may be formed on the first gate dielectric layer 120. The first gate electrode 125 may be formed within the recess hole 118. An upper surface of the first gate electrode 125 may be lower than an upper surface of the recess hole 118.

The first gate electrode 125 may be formed as a single layer or a double metal layer. For example, the first gate electrode 125 may be formed by using titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tungsten silicon nitride (WSiN), etc. These materials may be used alone or in combination thereof. The first gate electrode 125 may be formed by a CVD process or an atomic layer deposition (ALD) process.

A hard mask layer (not shown) covering the upper surface of the first gate electrode 125 may be formed in the recess hole 118. The hard mask layer may be formed using a nitride compound or an oxide compound. The nitride layers or the oxide layers may be formed by a CVD process. An upper portion of the hard mask layer may be removed and a second hard mask pattern 130 may be formed in the recess hole 118. The first hard mask pattern 115 and the pad oxide layer 110 may be removed while removing the upper portion of the hard mask layer at the same time.

Through performing the above process, integrated gate electrode structures 125 and 130 of the first gate electrode 125 and the second hard mask pattern 130 may be formed. The gate electrode structures 125 and 130 may be a buried-type formed within the semiconductor substrate 100. Accordingly, a transistor in the cell region may be a BCAT. For the BCAT, the gate electrode structures 125 and 130 may be buried in the substrate 100 and a height of the DRAM device may be reduced.

Figure 28:
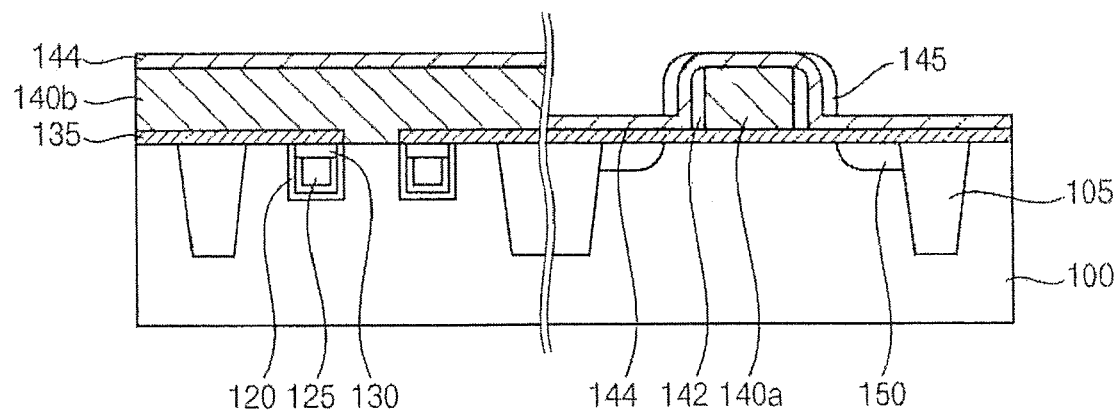

Referring to FIG. 28, a second gate dielectric layer 135 may be formed on the substrate 100. The second gate dielectric layer 135 may be used as a gate dielectric layer of a transistor formed in a peripheral region. The second gate dielectric layer 135 may be formed as a silicon oxide ($SiO_x$) layer, a hafnium oxide ($HfO_2$) layer, a tantalum oxide ($Ta_2O_5$) layer or an ONO (oxide/nitride/oxide) layer.

A portion of the second gate dielectric layer 135 formed in the cell region may be etched to form an opening exposing a portion of the substrate 100 in an active region of the cell region. The portion of the substrate 100 exposed by the opening may be a portion making contact with a bit line 140b.

A conductive layer (not shown) may be formed on the second gate dielectric layer 135. The conductive layer formed in the cell region may be provided as the bit line 140b through performing subsequent processes. The conductive layer formed in the peripheral region may be provided as a second gate electrode 140a through performing the subsequent processes.

The conductive layer may be formed by using titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tungsten silicon nitride (WSiN), etc. These materials may be used alone or in combination thereof. The conductive layer may be formed by a CVD process or an ALD process.

Through patterning the conductive layer by a photolithography process, the bit line 140b may be formed in the cell region and the second gate electrode 140a may be formed in the peripheral region. The bit line 140b in the cell region may make an electric contact with a portion of the surface of the substrate 100 in the active region as illustrated in FIG. 28.

A first oxide layer spacer 142 may be formed on the second gate electrode 140a in the peripheral region. The first oxide layer spacer 142 may be formed by patterning the second gate electrode 140a and then performing a heat treatment under an oxidizing atmosphere. The first oxide layer spacer 142 may be formed through a gate poly oxidation (Gpox) process for curing a surface damage generated during patterning for forming the second gate electrode 140a.

On the first oxide layer spacer 142, a nitride layer 144 to be used as an OSS may be formed. The nitride layer 144 may be formed to a thickness of about 100 Å to about 500 Å by a CVD process or an ALD process. The nitride layer 144 may be formed on the upper surface and the side wall of the bit line in the cell region, simultaneously.

A second oxide layer spacer 145 may be formed on the nitride layer 144. Then, a photoresist layer pattern (not shown) for selectively masking the cell region may be formed.

High concentration impurities may be doped into a surface portion of the substrate 100 in the peripheral region at both sides of the second gate electrode 140a including the first oxide layer spacer 142, the nitride layer 144 and the second oxide layer spacer 145. A highly doped impurity region 150 may be formed in the peripheral region. After doping the high concentration impurities, a heat treatment for activating the impurities may be carried out.

After forming the highly doped impurity region 150, the photoresist layer pattern formed in the cell region may be removed.

Figure 29:
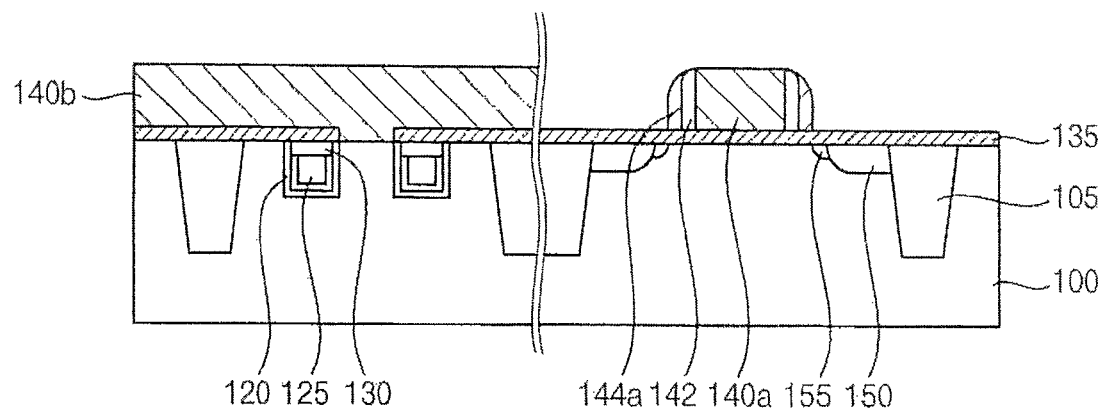

Referring to FIG. 29, the second oxide layer spacer 145 may be removed. The nitride layer formed on the substrate may be anisotropically etched to form an offset single spacer (OSS, 144a). Through the anisotropic etching process, all of the nitride layers formed on the bit line 140b may be removed.

In the cross-sectional view in FIG. 29, the offset single spacer may be shown only in the peripheral region. However, the spacer may be formed at both sides of the bit line 140b of the cell region.

Low concentration impurities may be doped into the substrate of the peripheral region by using the offset single spacer 144a as an ion doping mask. A lightly doped impurity region 155 may be formed in the substrate of the peripheral region.

Through forming a DRAM device in accordance with the above-described processes, an overlapping of the impurity doped regions with an underlying substrate of the bottom portion of the second gate electrode 140a may be restrained so that an overlapping capacitance may be improved.

When one offset spacer 144a was applied in the DRAM device in accordance with the conventional embodiments, a capping nitride layer has been additionally formed on the nitride layer for the offset spacer to selectively remove the oxide layer in the cell region. However, since the lightly doped impurity region may be formed after the highly doped impurity region, a separate process for forming the capping nitride layer may not be necessary in accordance with example embodiments. Therefore, the manufacturing process of the device may be simplified.

In addition, the number of the offset spacers remaining at both sides of the second gate electrodes 140a may be reduced and a horizontal area of the substrate for forming a contact plug in a following process may be sufficiently secured.

Figure 30:
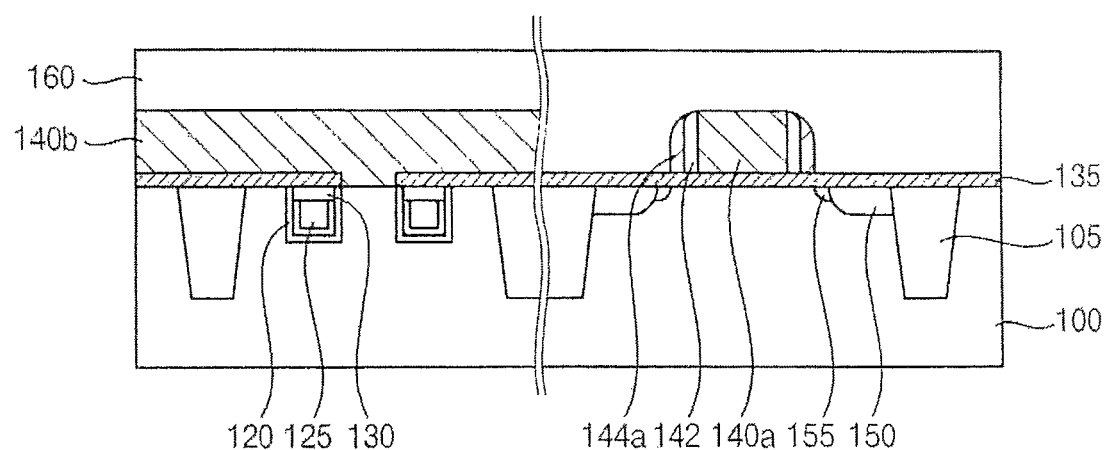

Referring to FIG. 30, an insulating interlayer 160 may be formed on the bit line 140b and on the second gate electrode 140a. The insulating interlayer 160 may be formed to a thickness of about 3,000 Å to about 5,000 Å as an oxide layer. The oxide layer may be formed through performing a CVD process. After forming the oxide layer, a planarization process by means of a chemical mechanical polishing (CMP) process may be performed.

Figure 31:
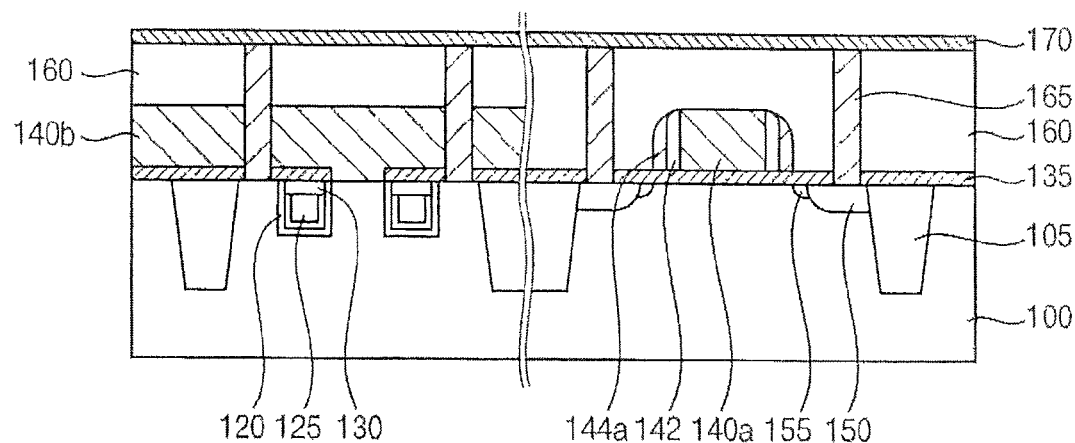

Referring to FIG. 31, a first contact hole (not shown) exposing a portion of the substrate 100 in the active region of the cell region may be formed. In the peripheral region, a second contact hole (not shown) exposing the surface of the substrate including the highly doped impurity region may be formed. A conductive layer may be formed in the first and second contact holes and then a planarization process may be performed to form contact plugs 165.

The contact plug 165 may include a metal material. The contact plug 165 may be formed by using titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tungsten silicon nitride (WSiN), etc. These materials may be used alone or in combination thereof. In particular, the contact plug 165 may be obtained by forming a titanium/titanium nitride layer along an inner surface of the first and second contact holes and depositing tungsten on the titanium nitride layer so as to fill up the inner space of the first and second contact holes.

A capping layer 170 may be formed on the contact plug 165 and the insulating interlayer 160. The capping layer 170 may be formed by depositing a nitride layer by a CVD process. The capping layer 170 may be used as an etch stop layer when a lower electrode hole of a capacitor is formed in a following process.

Figure 32:
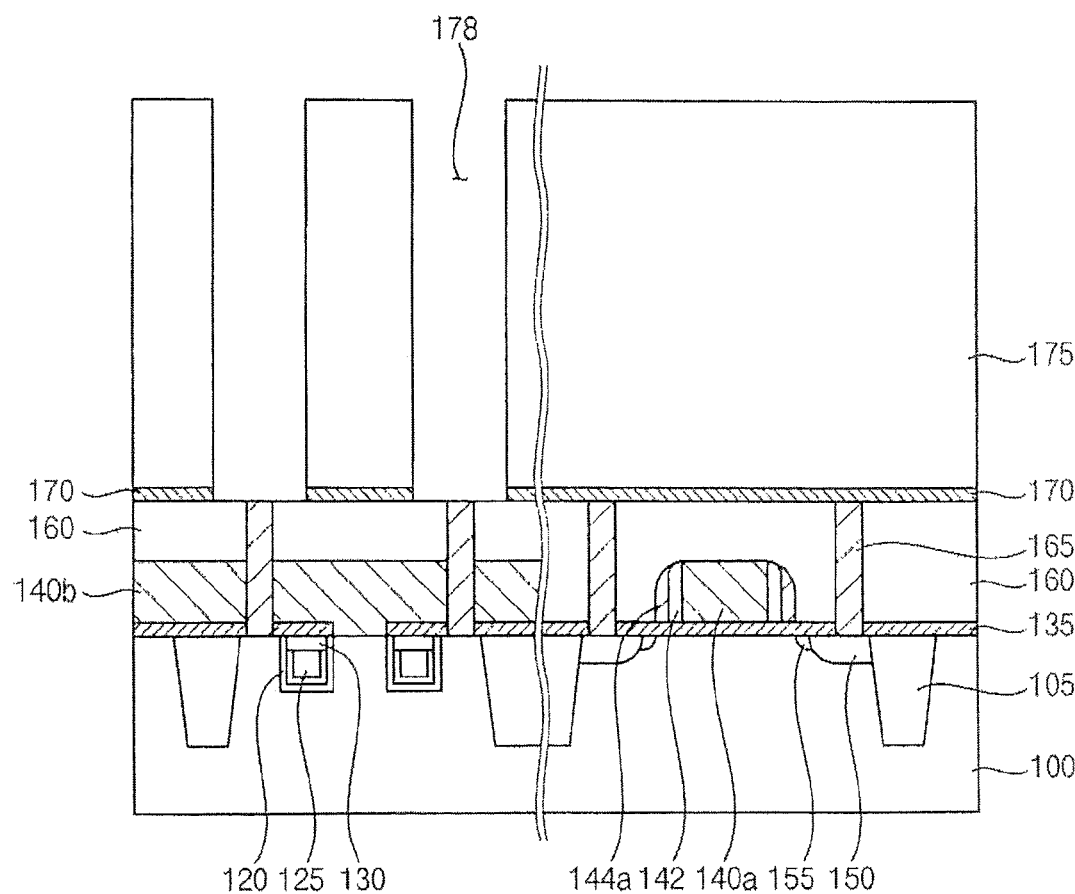

Referring to FIG. 32, a mold layer 175 may be formed on the capping layer 170. The mold layer 175 may be formed to a thickness of about 10,000 Å to about 20,000 Å. The mold layer 175 may be formed by depositing an oxide layer by a CVD process. The mold layer 175 is illustrated as a single layer in FIG. 32, however, the mold layer may be formed by using a plurality of layers having different etching ratios.

After depositing the mold layer 175, a mask pattern (not shown) necessary for performing a photolithography process may be formed. The mask pattern may have a shape to selectively expose the upper surface portion of the contact plug formed in the cell region. The mold layer 175 and the capping layer 170 may be etched using the mask pattern to form a lower electrode hole 178 of a capacitor exposing the upper surface of the contact plug 165 in the cell region. In this case, the mold layer 175 may be dry etched by using the capping layer 170 as an etch stopping layer. After the capping layer 170 is exposed, the capping layer 170 may be etched.

Figure 33:
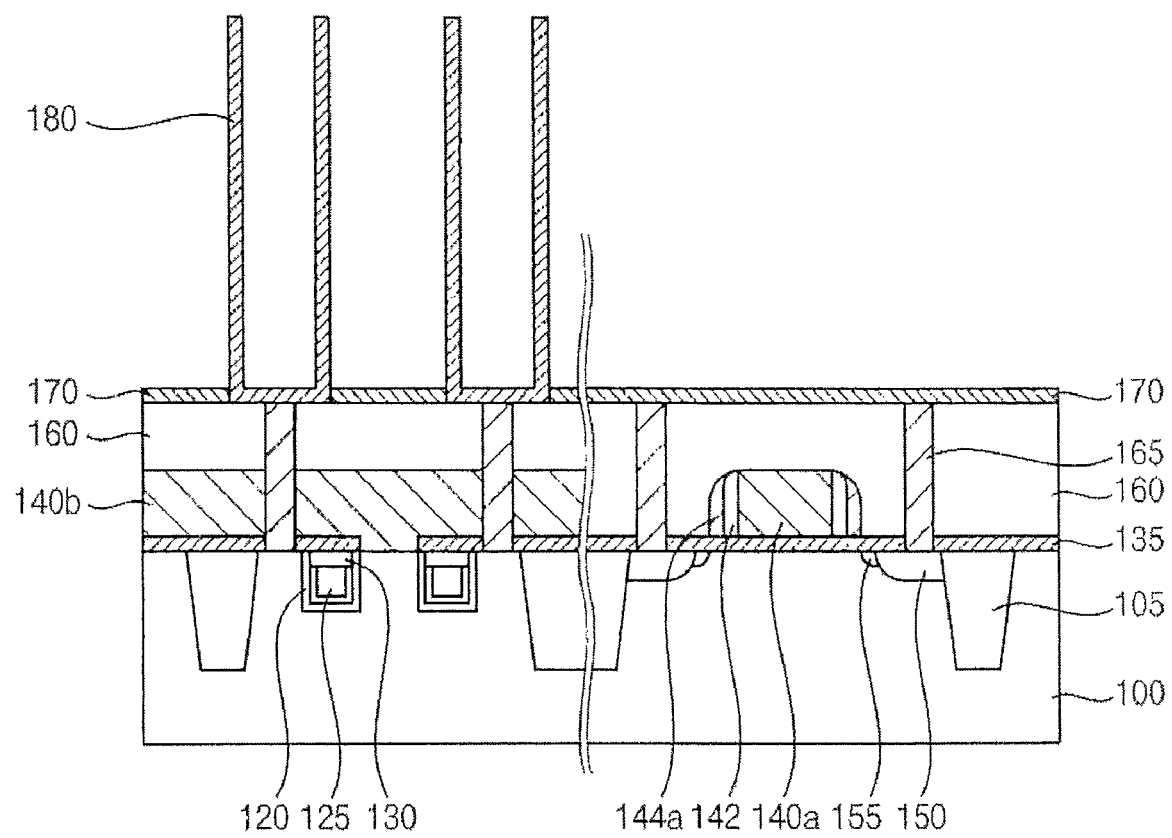

Referring to FIG. 33, the mask pattern (not shown) may be removed and a lower electrode layer (not shown) of a capacitor may be formed in the lower electrode hole 178. The lower electrode layer of the capacitor may be formed by using a material including TiN, Ti, TaN, Pt, etc. The lower electrode layer of the capacitor may have a good contacting characteristic with the underlying contact plug 165.

On the lower electrode layer of the capacitor, a buried layer (not shown) filling up the lower electrode hole may be formed. The buried layer may be formed by using an oxide having a good gap-filling property. Alternatively, the buried layer may be formed by using a material having a different etching ratio from the mold layer such as an organic material.

The buried layer may be planarized by means of an etch back process and an upper portion of the lower electrode layer of the capacitor may be removed simultaneously. The lower electrode layer of the capacitor may be separated and a cylinder-type lower electrode 180 may be formed. The separation of the lower electrode layer may be performed by using a wet etch back process.

When an end portion of the lower electrode 180 is sharp, a capacitor dielectric layer to be formed in a following process may be cut and a leakage current may be generated. Accordingly, during separating the lower electrode layer, the lower electrode 180 may be formed so as not to have a sharp end portion. The buried layer may be removed by performing a relatively deep wet etching and then, the lower electrode layer may be wet etched. Following these processes, the end portion of the lower electrode 180 may be formed to have a round shape.

Thereafter, the mold layer 175 and remaining buried layer may be removed through a LAL lift-off process. Attention may be paid during performing the removing process of the mold layer 175 and the buried layer so that the adjacent lower electrodes 180 may not incline to or may not make contact with each other.

A supporting structure to support the lower electrodes 180 so that adjacent lower electrodes 180 may not make contact with each other, may not incline to each other or may not fall down may be provided. For example, a ladder type supporting structure for connecting side walls of the lower electrodes 180 may be provided. Alternatively, a supporting structure having a ring shape for connecting the side walls of the lower electrodes 180 may be provided.

Figure 34:
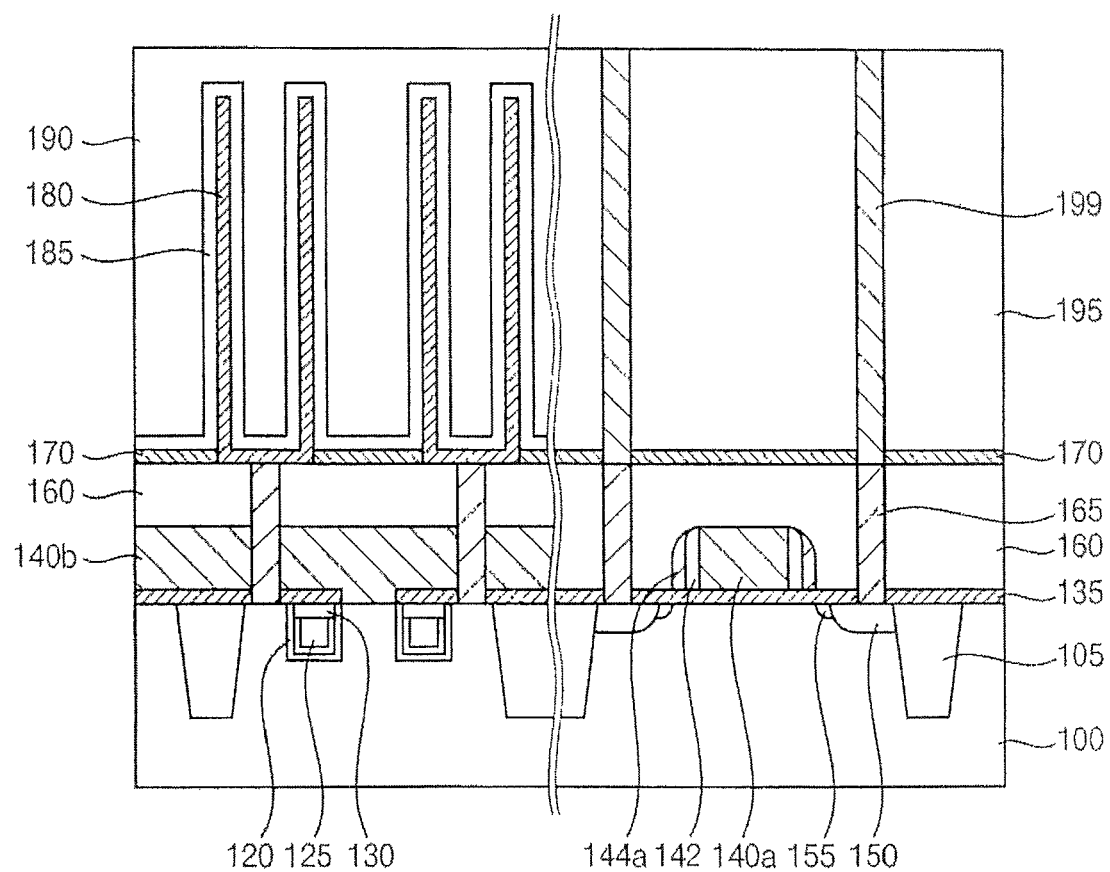

Referring to FIG. 34, a capacitor dielectric layer 185 may be formed on the lower electrode 180 of the capacitor. The capacitor dielectric layer 185 may be formed by depositing a zirconium oxide ($ZrO_2$) layer or a zirconium carbon oxynitride (ZrOCN) layer. Alternatively, the capacitor dielectric layer 185 may be formed by depositing a material having various high-k dielectric constants including ZAZ ($ZrO_2$/$Al_2O_3$/$ZrO_2$), ZAT ($ZrO_2$/$Al_2O_3$/$TaO_2$), $Hf_2O_3$, etc.

An upper electrode layer of the capacitor (not shown) may be formed on the capacitor dielectric layer 185. The upper electrode layer of the capacitor may be formed by integrating a metal material and polysilicon. In this case, the metal material may substantially function as the upper electrode layer of the capacitor and the metal material may be formed to have a very thin thickness when compared to the polysilicon. The metal material making a direct contact with the capacitor dielectric layer 185 may include TiN, Ti, TaN, Pt, etc.

The upper electrode layer in the peripheral region may be removed to form an upper electrode 190 on the capacitor dielectric layer 185. A cylinder-type capacitor may be completed on the substrate in the cell region.

Since the cylinder-type capacitor may be formed only in the cell region, the cell region may include a higher structure when comparing with the peripheral region. Therefore, the peripheral region may have a relatively lower step coverage than the cell region.

A planarizing insulating layer 195 may be formed on the cylinder-type capacitor formed in the cell region and the capping layer formed in the peripheral region. The planarizing insulating layer 195 may be formed to reduce the step coverage between the cylinder-type capacitor in the cell region and the peripheral region. The planarizing insulating layer 195 may be formed as a TEOS layer, an HDP layer, etc. After forming the planarizing insulating layer 195, a polishing process using a self-stopping CMP process in which a polishing degree may change depending on a pressure may be performed.

Metal wirings 199 penetrating the planarizing insulating layer 195 and making contact with the contact plugs in the peripheral region may be formed. After that, a passivation layer (not shown) for passivating the above-described structures may be formed.

Hereinafter, another example embodiment will be described.

Figure 35:
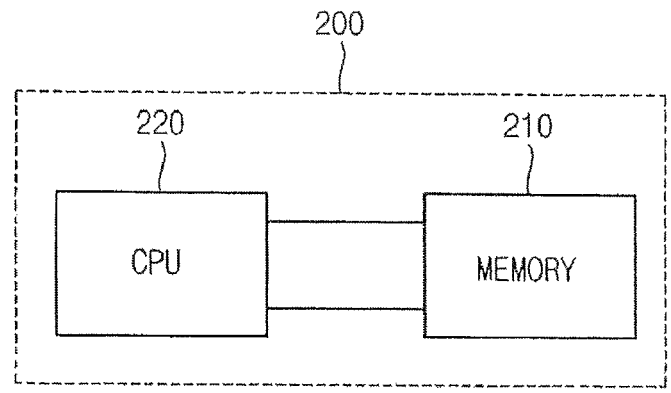

FIG. 35 is a block diagram illustrating a system employing a DRAM device manufactured in accordance with an example embodiment.

Referring to FIG. 35, a memory 210 may be connected to a central processing unit (CPU) 200 in a computer system 200. The memory may be a DRAM device including a buried channel array transistor. The transistor included in the DRAM device may have an LDD structure including an OSS. The LDD structure may be formed by forming a highly doped impurity region prior to a lightly doped impurity region.

The computer system 200 may be a laptop PC using the DRAM memory, a desk top PC commonly using the DRAM memory or an electronic device including the memory and the CPU. The system 200 may also include digital products including the memory 210 for storing data and controlling functions. The memory 210 may be directly connected to the CPU 220 or through a bus.

Figure 36:
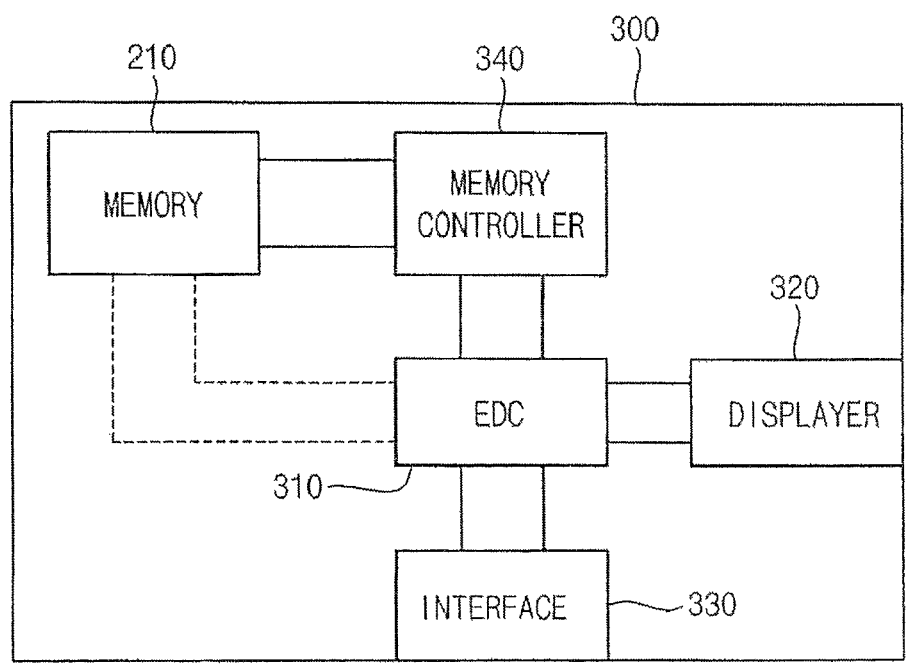

FIG. 36 is a block diagram illustrating a portable device employing a DRAM device manufactured in accordance with another example embodiment.

Referring to FIG. 36, a memory 210 may be a DRAM device including a buried channel array transistor. The transistor included in the DRAM device may have an LDD structure including an OSS. The LDD structure may be formed by forming a highly doped impurity region prior to a lightly doped impurity region.

A portable device 300 may be an MP3 player, a video player, a portable multi-media player (PMP) including a video and audio player, etc. The portable device 300 may include the memory 210, a memory controller 340, an encoder/decoder (EDC) 310, a displayer 320 and an interface 330.

Data may be input/output from the memory 210 via the memory controller 340 by means of the encoder/decoder 310.

The data may be directly input from the EDC 310 to the memory 210 or may be directly output from the memory 210 to the EDC 310 as illustrated as dotted lines in FIG. 36.

The EDC 310 may encode data for storing in the memory 210. For example, the EDC 310 may execute the MP3 and the PMP encoding for storing audio and video data in the memory 210.

Alternatively, the EDC 310 may execute an MPEG encoding for storing video data in the memory 210. In addition, the EDC 310 may include a complex encoder for encoding different types of data in accordance with different formats. For example, the EDC 310 may include an MP3 encoder for audio data and an MPEG encoder for video data.

The EDC 310 may decode outputs from the memory 210. For example, the EDC 310 may execute an MP3 decoding in accordance with output audio data from the memory 210. Alternatively, the EDC 310 may execute an MPEG decoding in accordance with output video data from the memory 210. For example, the EDC 310 may include an MP3 decoder for the audio data and an MPEG decoder for the video data.

The EDC 310 may include only the decoder. For example, encoder data may be received in advance by the EDC 310 and may be transferred to the memory controller 340 and/or the memory 210.

The EDC 310 may receive data for encoding or encoded data via an interface 330. The interface 330 may follow a known standard, for example, FireWire, USB, etc. For example, the interface 330 may include a FireWire interface, a USB interface, etc. Data may be output from the memory 210 via the interface 330.

The displayer 320 may display data output from the memory 210 or decoded by the EDC 310 for a user. For example, the displayer 320 may include a speaker jack, a display screen to output video data, etc.

As described above, the MOS transistor included in the DRAM device in accordance with example embodiments may accomplish a reduction of an overlapping capacitance and restraining of a short channel effect. Accordingly, the DRAM device in accordance with example embodiments may be applied to electronic appliances requiring a memory device having a high performance.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:

forming a gate electrode on a semiconductor substrate, the gate electrode having opposing side walls;

forming an offset spacer layer on the side walls of the gate electrode and on an upper surface of the semiconductor substrate;

forming spacers on the side walls of the offset spacer layer;

doping impurities into the semiconductor substrate on opposing sides of the spacers to form highly doped impurity regions having a first concentration of doping impurities in the semiconductor substrate;

selectively removing the spacers to expose portions of the semiconductor substrate between the highly doped impurity regions and the gate electrode;

anisotropically etching the offset spacer layer to form an offset spacer; and forming lightly doped impurity regions in the exposed portions of the semiconductor substrate between the highly doped impurity regions and the gate electrode, the lightly doped impurity regions having a second concentration of impurities that is lower than the first concentration of impurities.

2. The method of claim 1, further comprising forming side wall oxide spacers by oxidizing the side walls of the gate electrode.

3. The method of claim 1, wherein the spacers comprise silicon oxide.

4. The method of claim 1, wherein the offset spacer layer comprises silicon nitride.

5. The method of claim 1, wherein forming the spacers comprises
forming a spacer layer on the offset spacer layer; and
anisotropically etching the spacer layer.

6. A method of manufacturing a semiconductor device, comprising:
forming a gate electrode on a semiconductor substrate in a peripheral region of the semiconductor substrate, the semiconductor substrate being divided into a cell region and the peripheral region, the gate electrode having opposing side walls;
forming spacers on the side walls of the gate electrode;
doping impurities into the semiconductor substrate in the peripheral region on opposing sides of the spacers to form highly doped impurity regions having a first concentration of doping impurities in the semiconductor substrate;
removing the spacers from the side walls of the gate electrode;
forming lightly doped impurity regions in the substrate on the opposing sides of the gate electrode, wherein the lightly doped impurity regions are between the highly doped impurity regions and the gate electrode, the lightly doped impurity regions having a second concentration of impurities that is lower than the first concentration of impurities; and
forming a photoresist layer pattern on the cell region after forming the spacers.

7. The method of claim 6, further comprising forming side wall oxide spacers on the gate electrode by oxidizing the side walls of the gate electrode.

8. The method of claim 6, wherein the spacers comprise silicon oxide.

9. The method of claim 6, further comprising:
forming an offset spacer layer on an upper surface of the substrate and on the side walls of the gate electrode; and
anisotropically etching the offset spacer layer to form offset spacers on the side walls of the gate electrode.

10. The method of claim 9, wherein the offset spacer layer comprises silicon nitride.

11. The method of claim 9, wherein the spacers are formed by:
forming a spacer layer on the offset spacer layer; and
anisotropically etching the spacer layer.

12. The method of claim 6, wherein a conductive layer pattern is formed as a bit line in the cell region during formation of the gate electrode in the peripheral region.

13. A method of manufacturing a semiconductor device, comprising:
forming a gate electrode on a semiconductor substrate in a peripheral region of the semiconductor substrate, the semiconductor substrate being divided into a cell region and the peripheral region, the gate electrode having opposing side walls;
forming an offset spacer layer on the side walls of the gate electrode and on an upper surface of the semiconductor substrate;
forming spacers on the side walls of the offset spacer layer;
doping impurities into the semiconductor substrate in the peripheral region on opposing sides of the spacers to form highly doped impurity regions having a first concentration of doping impurities in the semiconductor substrate;
removing the spacers from the side walls of the gate electrode;
anisotropically etching the offset spacer layer to form an offset spacer; and
forming lightly doped impurity regions in the substrate on the opposing sides of the gate electrode, wherein the lightly doped impurity regions are between the highly doped impurity regions and the gate electrode, the lightly doped impurity regions having a second concentration of impurities that is lower than the first concentration of impurities
wherein a conductive layer pattern is formed as a bit line in the cell region during formation of the gate electrode in the peripheral region; and
wherein forming the spacers comprises:
forming a spacer layer on the offset spacer layer; and
anisotropically etching the spacer layer to form first spacers on side walls of the gate electrode and second spacers on side walls of the conductive layer pattern.

14. The method of claim 13, wherein the second spacers on the side walls of the conductive layer pattern in the cell region are removed during removal of the first spacers from the side walls of the gate electrode.

15. The method of claim 13, wherein forming a spacer layer on the offset spacer layer further comprises forming the spacer layer in the cell region, and portions of the spacer layer formed in the cell region are removed during anisotropic etching of the spacer layer.

16. The method of claim 13, further comprising forming a photoresist layer pattern on the cell region after forming the spacers.

17. The method of claim 13, further comprising heat treating the substrate to activate the high concentration impurities after forming the highly doped impurity regions.

18. The method of claim 17, wherein a conductive layer pattern having sidewalls is formed as a bit line in the cell region during formation of the gate electrode in the peripheral region and the spacers comprise first spacers, and wherein a second spacer is formed on the side wall of the conductive layer pattern in the cell region during anisotropic etching for forming the offset spacer on the side wall of the gate electrode.

19. A method of manufacturing a semiconductor device, comprising:
forming a gate electrode on a semiconductor substrate;
forming an offset spacer layer on the side walls of the gate electrode and on an upper surface of the semiconductor substrate;
forming a spacer on a side wall of the offset spacer layer;
doping impurities into the substrate adjacent the spacer to form a highly doped impurity region having a first concentration of doping impurities;
selectively removing the spacer to expose a portion of the semiconductor substrate between the highly doped impurity region and the gate electrode;

anisotropically etching the offset spacer layer to form an offset spacer; and forming a lightly doped impurity region in the exposed portion of the substrate between the highly doped impurity region and the gate electrode, the lightly doped impurity region having a second concentration of impurities that is lower than the first concentration of impurities.

20. The method of claim 1, wherein anisotropically etching the offset spacer layer to form an offset spacer is performed after doping impurities into the semiconductor substrate on opposing sides of the spacers to form the highly doped impurity regions having the first concentration of doping impurities in the semiconductor substrate.

21. The method of claim 19, wherein anisotropically etching the offset spacer layer to form an offset spacer is performed after doping impurities into the substrate adjacent the spacer to form the highly doped impurity region having the first concentration of doping impurities.

* * * * *